United States Patent
Yuda et al.

(10) Patent No.: US 10,483,110 B2
(45) Date of Patent: Nov. 19, 2019

(54) SEMICONDUCTOR DEVICE AND METHOD OF MANUFACTURING SEMICONDUCTOR DEVICE

(71) Applicant: Mitsubishi Electric Corporation, Chiyoda-ku (JP)

(72) Inventors: Yohei Yuda, Tokyo (JP); Tatsuro Watahiki, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/307,558

(22) PCT Filed: Jun. 8, 2017

(86) PCT No.: PCT/JP2017/021316
§ 371 (c)(1),
(2) Date: Dec. 6, 2018

(87) PCT Pub. No.: WO2018/020849
PCT Pub. Date: Feb. 1, 2018

(65) Prior Publication Data
US 2019/0267237 A1     Aug. 29, 2019

(30) Foreign Application Priority Data
Jul. 26, 2016   (JP) ................. 2016-145985

(51) Int. Cl.
*H01L 21/04*       (2006.01)
*H01L 29/47*       (2006.01)
(Continued)

(52) U.S. Cl.
CPC ...... *H01L 21/0495* (2013.01); *H01L 29/1608* (2013.01); *H01L 29/402* (2013.01); *H01L 29/47* (2013.01); *H01L 29/872* (2013.01)

(58) Field of Classification Search
None
See application file for complete search history.

(56) References Cited

U.S. PATENT DOCUMENTS 9,324,806 B2* 4/2016 Tadokoro ............ H01L 29/1608
2015/0318357 A1   11/2015 Tadokoro et al.

FOREIGN PATENT DOCUMENTS

JP     2007-81231 A     3/2007
JP     2012-248736 A    12/2012
(Continued)

OTHER PUBLICATIONS

International Search Report dated Aug. 1, 2017, in PCT/JP2017/021316, filed Jun. 8, 2017.

*Primary Examiner* — Jack S Chen
(74) *Attorney, Agent, or Firm* — Oblon, McClelland, Maier & Neustadt, L.L.P.

(57) ABSTRACT

A p-type oxide semiconductor is prevented from being oxidized by oxygen in an n-type oxide semiconductor even if the p-type oxide semiconductor is provided as a termination structure in the n-type oxide semiconductor. A semiconductor device includes an n-type gallium oxide substrate, an anode electrode joined to the n-type gallium oxide substrate, and a cathode electrode provided on the n-type gallium oxide substrate. Current flows between the anode electrode and the cathode electrode via the n-type gallium oxide substrate provided between the anode electrode and the cathode electrode. The semiconductor device further includes a p-type oxide semiconductor layer provided adjacent to a junction between the anode electrode and the n-type gallium oxide substrate, and a nitride layer provided between the p-type oxide semiconductor layer and the n-type gallium oxide substrate.

15 Claims, 11 Drawing Sheets

(51) Int. Cl.
 *H01L 29/40* (2006.01)
 *H01L 29/16* (2006.01)
 *H01L 29/872* (2006.01)

(56) References Cited

FOREIGN PATENT DOCUMENTS

| | | |
|---|---|---|
| JP | 2013-165284 A | 8/2013 |
| JP | 2015-211179 A | 11/2015 |
| WO | WO 2013/069729 A1 | 5/2013 |
| WO | WO 2013/122084 A1 | 8/2013 |

\* cited by examiner

F I G. 2
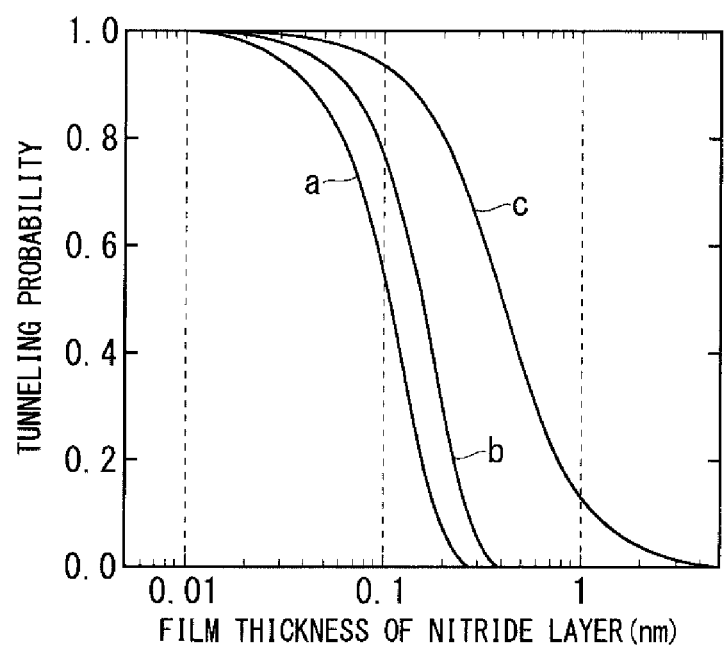

F I G . 4 A
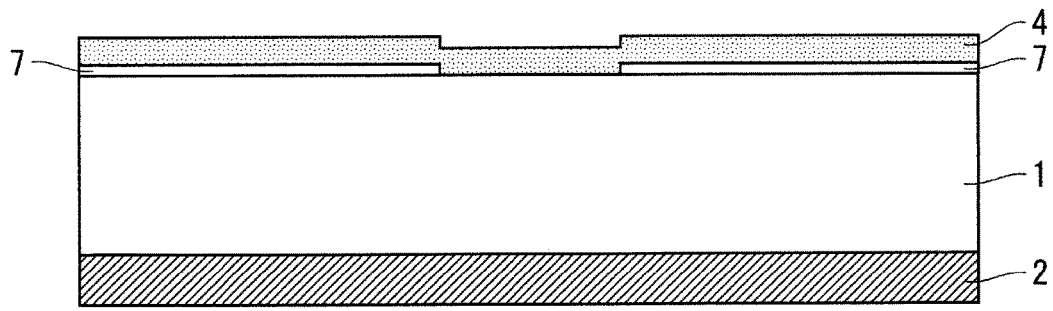
F I G . 4 B
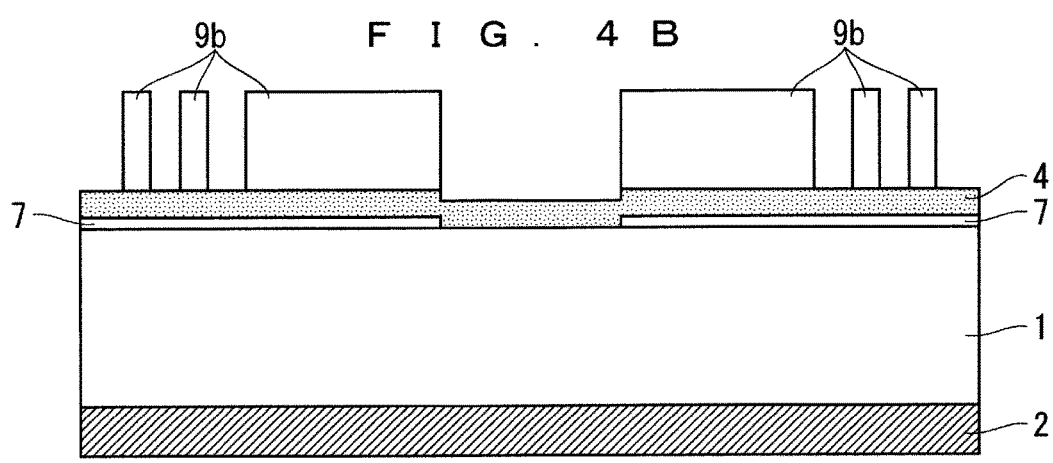
F I G . 4 C
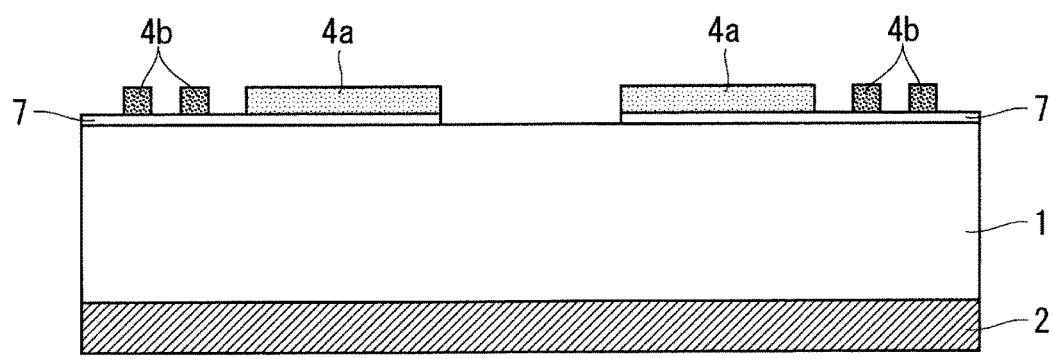

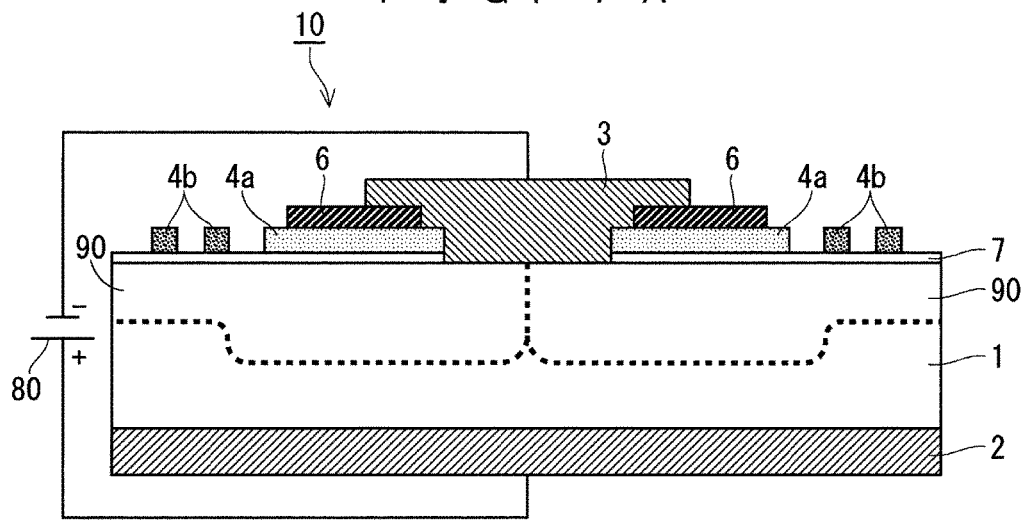
F I G . 7 A
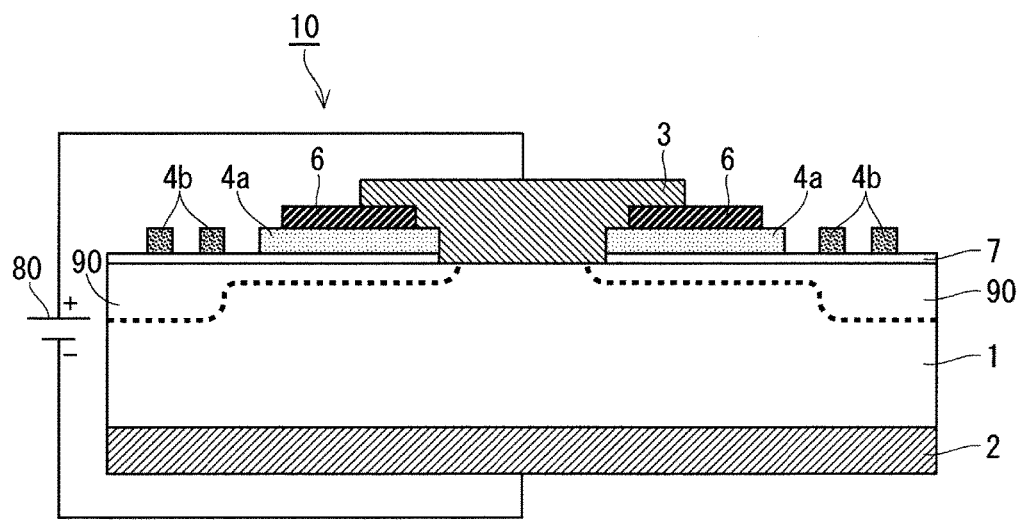
F I G . 7 B

SEMICONDUCTOR DEVICE AND METHOD OF MANUFACTURING SEMICONDUCTOR DEVICE

TECHNICAL FIELD

A technique disclosed in the specification of the present application relates to a semiconductor device using, for example, an oxide semiconductor and a method of manufacturing the semiconductor device.

BACKGROUND ART

Diodes are semiconductor devices essential to power converters such as converters or inverters, along with switching devices such as insulated gate bipolar transistors (IGBTs) and metal-oxide semiconductor field-effect transistors (MOSFETs). The field of application of these power converters has been spread to not only industrial and household electrical equipment but also other equipment including transportation equipment such as railway vehicles and automobiles and power transmission and distribution equipment of electric power systems, and there has been demand to increase electric power and reduce loss in semiconductor devices such as diodes and switching devices.

Accordingly, in spite of the fact that the dominating semiconductor devices have conventionally been those using silicon (Si), semiconductor devices using a semiconducting material that has a larger band gap than Si, such as silicon carbide (SiC) or gallium nitride (GaN), have been developed. In recent years, semiconductor devices using gallium oxide ($Ga_2O_3$) have been developed, the gallium oxide being an oxide semiconductor that has a larger band gap than SiC and GaN and serving as a semiconducting material that is expected to further increase electric power and reduce loss.

A conventional semiconductor device using gallium oxide configures a Schottky barrier diode using gallium oxide, in which a cathode electrode is provided on one surface of an n-type gallium oxide substrate that contains n-type impurities to be ohmic-joined, an n-type gallium oxide layer with a lower n-type carrier density than the n-type gallium oxide substrate is provided on the other surface of the n-type gallium oxide substrate, and an anode electrode is provided on the n-type gallium oxide layer to be Schottky joined (see, for example, Patent Document 1).

Incidentally, as compared with PN diodes, Schottky barrier diodes can in principle reduce forward voltage and thus may be used to improve the efficiency of power converters in high power applications where a large current flows into diodes. Also, Schottky barrier diodes are unipolar devices and capable of switching faster than PN diodes, and thus they may be used to reduce the sizes of power converters by increasing switching frequencies. In particular, when SiC is used as a semiconducting material, the reverse withstand voltage for the case where a reverse bias is applied can be increased because SiC has a larger band gap than Si, and accordingly Schottky barrier diodes that have reverse withstand voltages of approximately several kilovolts have been put into practical use.

Conventional semiconductor devices using SiC include a p-type semiconductor region formed adjacent to and around a Schottky junction portion of an n-type SiC layer that is Schottky joined with an anode electrode, and this structure allows the provision of a termination structure that includes a PN junction. Schottky barrier diodes with improved reverse withstand voltages have been configured in this way.

In the termination structure of a conventional Schottky barrier diode using SiC, the p-type semiconductor region is formed by doping the n-type SiC layer doped with n-type impurities with p-type impurities and thereby making the p-type impurity concentration in the SiC layer higher than the n-type impurity concentration therein (see, for example, Patent Document 2).

Meanwhile, PN diodes using an oxide and PIN structures that include an insulation layer at the PN interface have conventionally been proposed. A structure that inserts an i-type semiconductor layer into the interface of the PN junction has the advantages of increasing the expanse of a depletion layer when a reverse voltage is applied and obtaining high-speed response characteristics as a device (see, for example, Patent Document 3).

PRIOR ART DOCUMENTS

Patent Documents

Patent Document 1: International Patent Publication No. WO 2013/069729
Patent Document 2: Japanese Patent Application Laid-Open No. 2012-248736
Patent Document 3: International Patent Publication No. WO 2013/122084

SUMMARY

Problem to be Solved by the Invention

The Schottky barrier diode disclosed in Patent Document 1 that uses gallium oxide as an oxide semiconductor has a problem in that it is not possible to further improve the reverse withstand voltage because no termination structure is provided adjacent to and around the Schottky junction portion between the n-type oxide semiconductor layer and the anode electrode.

Also, in the case where the termination structure with the PN junction that is used in the Schottky barrier diode using SiC described in Patent Document 2 is applied to a Schottky barrier diode using an oxide semiconductor, even if a p-type oxide semiconductor is provided on an n-type oxide semiconductor to form a PN junction, there is a problem in that the p-type oxide semiconductor is oxidized by oxygen in the n-type oxide semiconductor and loses its p-type conductivity, and accordingly the effect of the termination structure with the PN junction becomes insufficient.

Moreover, in the case where in the PIN structure using an oxide semiconductor described in Patent Document 3, the material for the i-type semiconductor layer is assumed to be an oxide, even if a p-type oxide semiconductor is provided on an n-type oxide semiconductor to form a PN junction, the p-type oxide semiconductor is oxidized by oxygen in the n-type oxide semiconductor and loses its p-type conductivity, and accordingly the effect of the termination structure with the PN junction becomes insufficient, similarly to as described above.

The technique disclosed in the specification of the present application has been achieved in order to solve the problems as described above, and it is an object of the present invention to provide a semiconductor device and a semiconductor device manufacturing method that prevent a p-type oxide semiconductor from being oxidized by oxygen in an n-type oxide semiconductor even if the p-type oxide semiconductor is provided as a termination structure on the n-type oxide semiconductor.

Means to Solve the Problem

A semiconductor device according to the present invention includes an n-type oxide semiconductor layer, a first electrode joined to a first main surface of the n-type oxide semiconductor layer, and a second electrode provided on the first main surface of the n-type oxide semiconductor layer or on a second main surface that is a surface on a rear side of the first main surface. Current flows between the first electrode and the second electrode via the n-type oxide semiconductor layer provided between the first electrode and the second electrode. The semiconductor device further includes a p-type oxide semiconductor layer provided adjacent to a junction between the first electrode and the n-type oxide semiconductor layer, and a nitride layer provided between the p-type oxide semiconductor layer and the n-type oxide semiconductor layer.

A semiconductor device manufacturing method according to the present invention includes the steps of forming a nitride layer on a surface of an n-type oxide semiconductor layer that contains metal oxide, through nitridation of metal contained in the metal oxide, the nitride layer having an opening that exposes the n-type oxide semiconductor layer, forming a p-type oxide semiconductor layer on the nitride layer, and forming an electrode that is joined to the n-type oxide semiconductor layer in the opening.

Effects of the Invention

According to the semiconductor device of the present invention, the nitride layer is provided between the p-type oxide semiconductor layer and the n-type oxide semiconductor layer. Thus, it is possible to provide a semiconductor device that prevents the p-type oxide semiconductor from being oxidized by oxygen in the n-type oxide semiconductor.

According to the semiconductor device manufacturing method of the present invention, the nitride layer is formed through nitridation of the surface of the n-type oxide semiconductor layer. Thus, it is possible to provide a semiconductor device manufacturing method that prevents the p-type oxide semiconductor from being oxidized by oxygen in the n-type oxide semiconductor.

The object, features, and advantages relating to the technique disclosed in the specification of the present application will become further apparent from the following detailed description and the accompanying drawings.

BRIEF DESCRIPTION OF DRAWINGS

FIG. 2 illustrates the results of simulations of the film thickness of a nitride layer 7 according to Embodiments 1 to 5 of the present invention.

FIGS. 4A to 4C illustrate the semiconductor device manufacturing method according to Embodiment 1 of the present invention.

FIGS. 7A to 7B are schematic cross-sectional views illustrating operations of the semiconductor device according to Embodiment 1 of the present invention.

DESCRIPTION OF EMBODIMENTS

Embodiment 1

Figure 1A:
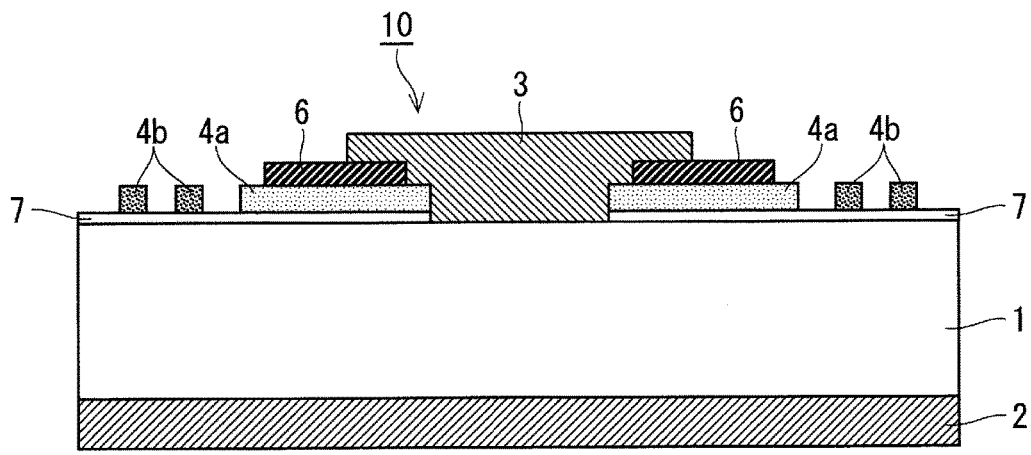
FIG. 1A provides a cross-sectional view and FIG. 1B provides a top view of a semiconductor device according to Embodiment 1 of the present invention.
Figure 1B:
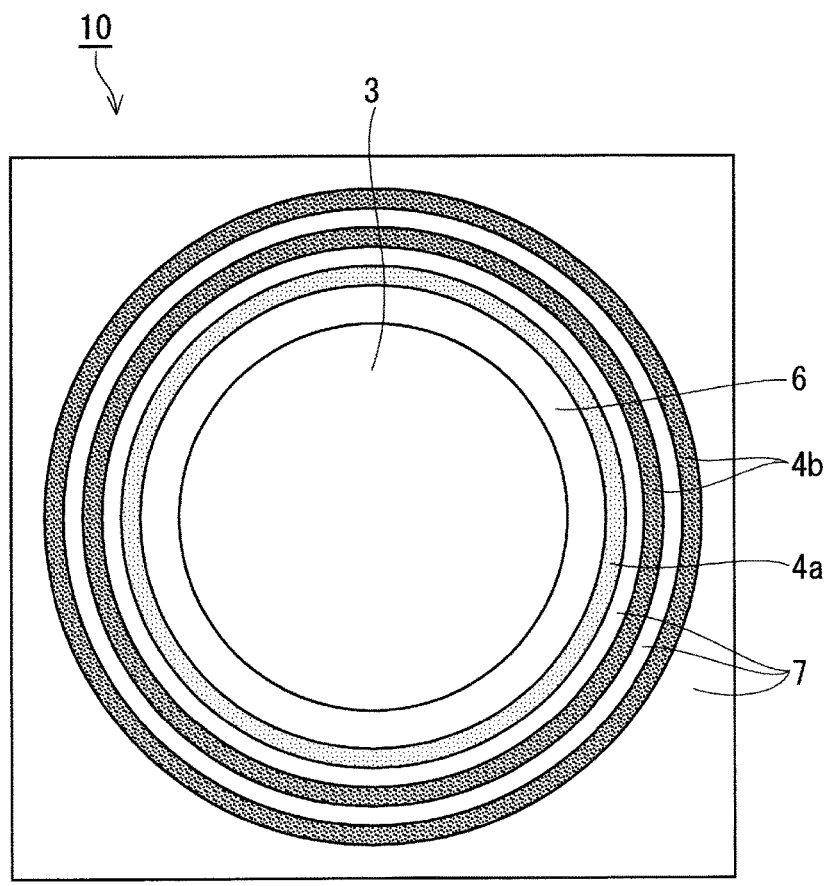

First, a configuration of a semiconductor device according to Embodiment 1 of the present invention will be described. FIG. 1A provides a cross-sectional view and FIG. 1B provides a top view of the semiconductor device according to Embodiment 1 of the present invention. FIG. 1A is a cross-sectional view of a configuration of a semiconductor device 10, and FIG. 1B is a top view of the configuration of the semiconductor device 10. Note that although FIG. 1B is not a cross-sectional view, some constituent elements are shown hatched therein in order to clarify the constituent elements of the semiconductor device 10. Similarly, some constituent elements in the following other top views of the present invention are also shown hatched in the same manner.

The word "on" according to the present invention does not eliminate the possibility of the presence of an inclusion between constituent elements. For example, the words "B provided on A" refer not only to the case where another constituent element C is present between A and B, but also to the case where there are no other constituent elements therebetween.

While the present embodiment describes a Schottky barrier diode that includes an anode electrode as a first electrode and a cathode electrode as a second electrode as an example of a semiconductor device, the semiconductor device is not limited to this Schottky barrier diode, and may be a semiconductor device that configures another switching device.

As illustrated in FIGS. 1A and 1B, the semiconductor device 10 is a Schottky barrier diode and includes a cathode electrode 2 that is ohmic-joined with an n-type gallium oxide substrate 1 serving as an n-type oxide semiconductor layer, and an anode electrode 3 that is Schottky joined with the n-type gallium oxide substrate 1.

The n-type gallium oxide substrate 1 is a substrate that includes an n-type oxide semiconductor layer of n-type gallium oxide serving as an n-type oxide semiconductor. The n-type gallium oxide substrate 1 has a first main surface and a second main surface provided on the rear side of the first main surface. The second main surface of the n-type gallium oxide substrate 1 is ohmic-joined with the cathode electrode 2, and the first main surface of the n-type gallium oxide substrate 1 is Schottky joined with the anode electrode 3. Also, a p-type oxide semiconductor layer 4a of a p-type oxide semiconductor is provided adjacent to and around the Schottky junction portion between the n-type gallium oxide substrate 1 and the anode electrode 3. Note that the words "being adjacent" according to the present invention do not necessarily require "being in contact" and refer to only "being adjacent to each other," i.e., "being in proximity to each other."

The p-type oxide semiconductor layer 4a is provided on the first main surface of the n-type gallium oxide substrate 1 where the anode electrode 3 is provided, and has an opening in the Schottky junction portion between the n-type gallium oxide substrate 1 and the anode electrode 3 in plan view. Outside the p-type oxide semiconductor layer 4a, guard rings 4b of a p-type oxide semiconductor serving as p-type oxide semiconductor layers are provided separately from the p-type oxide semiconductor layer 4a so as to surround the p-type oxide semiconductor layer 4a. The p-type oxide semiconductor layer 4a and the guard rings 4b constitute a termination structure of the semiconductor device 10 serving as a Schottky barrier diode, and the p-type oxide semiconductor layer 4a and the guard rings 4b produce a depletion layer within the n-type gallium oxide substrate 1.

A nitride layer 7 is provided on the first main surface of the n-type gallium oxide substrate 1, except on the Schottky junction portion thereof with the anode electrode 3. In other words, the nitride layer 7 is provided between the n-type gallium oxide substrate 1 and both the p-type oxide semiconductor layer 4a and the guard rings 4b of the p-type oxide semiconductor. That is, the nitride layer 7 is provided at the interface of a PN junction between the n-type oxide semiconductor layer and the p-type oxide semiconductor layers. The p-type oxide semiconductor layer 4a and the nitride layer 7 are provided on the surface of the n-type gallium oxide substrate 1 serving as the n-type oxide semiconductor layer.

On the p-type oxide semiconductor layer 4a, a field plate insulation layer 6 of an insulator is provided that has an opening larger than the opening of the p-type oxide semiconductor layer 4a, the opening being formed to surround the Schottky junction portion. Part of the anode electrode 3 is also provided on the p-type oxide semiconductor layer 4a and the field plate insulation layer 6. The anode electrode 3 is in contact with part of the p-type oxide semiconductor layer 4a that is provided in the opening of the field plate insulation layer 6, and the anode electrode 3 and the p-type oxide semiconductor layer 4a are ohmic-joined. Part of the anode electrode 3 is also located on the field plate insulation layer 6, so that part of the field plate insulation layer 6 is provided between the p-type oxide semiconductor layer 4a and the anode electrode 3 in the configuration. A portion where the field plate insulation layer 6 and the anode electrode 3 are laminated one on another constitutes a field plate structure and improves the reverse withstand voltage of the semiconductor device 10 serving as a Schottky barrier diode.

Note that although the field plate insulation layer 6 is provided on only the p-type oxide semiconductor layer 4a in FIGS. 1A and 1B, the field plate insulation layer 6 may also be provided up to a region where the field plate insulation layer 6 covers the guard rings 4b. Also, in addition to the configuration in FIGS. 1A and 1B, an insulator that does not contain oxygen, e.g., a cap layer such as gallium nitride (GaN), may be provided on the first main surface of the n-type gallium oxide substrate 1 in order to protect the p-type oxide semiconductor layer 4a and the guard rings 4b. The cap layer may be provided on the entire first main surface of the n-type gallium oxide substrate 1, except in an opening for connecting a metal wire to the anode electrode 3.

The n-type gallium oxide substrate 1 is an n-type oxide semiconductor of a monocrystal or polycrystal of $Ga_2O_3$, and more preferably an n-type oxide semiconductor of a monocrystal of $\beta$-$Ga_2O_3$. The gallium oxide semiconductor exhibits n-type conductivity due to oxygen deficiency in the crystal and thus does not need to contain n-type impurities, but it may contain n-type impurities such as silicon (Si) or tin (Sn). That is, the n-type gallium oxide substrate 1 may be one of the following n-type oxide semiconductors: one that exhibits n-type conductivity due only to oxygen deficiency, one that exhibits n-type conductivity due only to n-type impurities, and one that exhibits n-type conductivity due both to oxygen deficiency and n-type impurities. The n-type carrier density of the n-type gallium oxide substrate 1 is a total density of oxygen deficiency and n-type impurities, and may, for example, be in the range of approximately $1 \times 10^{17}$ to $1 \times 10^{18}$ cm$^{-3}$.

The cathode electrode 2 is ohmic-joined with the n-type gallium oxide substrate 1 and is thus preferably made of a metallic material having a lower work function than the work function of the n-type gallium oxide substrate 1. Also, the metallic material preferably serves to reduce the contact resistance between the n-type gallium oxide substrate 1 and the cathode electrode 2 through heat treatment that is performed after the cathode electrode 2 is formed on the second main surface of the n-type gallium oxide substrate 1. One example of such a metallic material is titanium (Ti). The cathode electrode 2 may also be configured by laminating a plurality of metallic materials. For example when a metallic material that comes in contact with the second main surface of the n-type gallium oxide substrate 1 is an easily oxidized metallic material, a metallic material that is resistant to oxidation may be formed on that easily oxidized metallic material so as to form the cathode electrode 2 having a laminated structure. For example, the cathode electrode 2 may be configured by forming Ti as a first layer that comes in contact with the n-type gallium oxide substrate 1 and forming gold (Au) or silver (Ag) as a second layer on Ti serving as the first layer. Note that the cathode electrode 2 may be formed on the entire second main surface of the n-type gallium oxide substrate 1, or may be formed on part of the second main surface.

The anode electrode 3 is Schottky joined with the n-type gallium oxide substrate 1 and is thus configured of a metallic material having a higher work function than the work function of the n-type gallium oxide substrate 1. Preferably, the metallic material has a lower work function than the work function of the p-type oxide semiconductor that configures the p-type oxide semiconductor layer 4a, because the anode electrode 3 is ohmic-joined with the p-type oxide semiconductor layer 4a of the p-type oxide semiconductor. Examples of such a metallic material include platinum (Pt), nickel (Ni), gold (Au), and palladium (Pd). Like the cathode electrode 2, the anode electrode 3 may have a laminated structure, and may be configured by forming a metallic material that is suitable for the Schottky junction with the n-type gallium oxide substrate 1 as a first layer to come in contact with the n-type gallium oxide substrate 1 and forming a metallic material that is suitable for an ohmic junction with the p-type oxide semiconductor layer 4a of the p-type oxide semiconductor as a second layer on the first layer to come in contact with the p-type oxide semiconductor layer 4a. Alternatively, the anode electrode 3 may be configured by forming an easily oxidized metallic material as a first layer to come in contact with the n-type gallium oxide substrate 1 and the p-type oxide semiconductor layer 4a, and forming a metallic material that is resistant to oxidation as a second layer on the first layer. For example, the anode electrode 3 may be configured of a first layer of Ni that comes in contact with the n-type gallium oxide substrate 1 and the p-type oxide semiconductor layer 4a, and a second layer of Au or Ag.

The p-type oxide semiconductor layer 4a is configured of a p-type oxide semiconductor that exhibits p-type conductivity, such as copper oxide ($Cu_2O$), silver oxide ($Ag_2O$), nickel oxide (NiO), or tin oxide (SnO), without being doped with p-type impurities. For example, in the case of $Cu_2O$, the 3d orbital of Cu forms the upper edge of the valence band that undertakes hole conduction, and holes appear due to Cu deficiency, so that the p-type oxide semiconductor exhibits p-type conductivity. Then, since $Cu_2O$ is transformed into CuO by oxidation, the 3 d-orbital of Cu no longer forms the upper edge of the valence band, and the p-type oxide semiconductor loses its p-type conductivity. The p-type oxide semiconductor layer 4a is configured of a p-type oxide semiconductor of metal oxide having such properties, and generally the p-type oxide semiconductor exhibits p-type conductivity without being doped with p-type impurities.

Alternatively, the p-type oxide semiconductor layer 4a may be a p-type oxide semiconductor of $Cu_2O$, $Ag_2O$, NiO, or SnO that contains indium oxide ($In_2O_3$), gallium oxide ($Ga_2O_3$), or zinc oxide (ZnO). Note that although the p-type oxide semiconductor layer 4a is configured of a p-type oxide semiconductor that exhibits p-type conductivity without being doped with p-type impurities as described above, the p-type oxide semiconductor layer 4a may be doped with p-type impurities. For example, in the case of $Cu_2O$, nitrogen (N) may be used as p-type impurities. When the p-type oxide semiconductor is doped with p-type impurities, the p-type carrier density of the p-type oxide semiconductor is a total of metal atom deficiency and p-type impurities in the p-type oxide semiconductor. Thus, although there are cases where the p-type oxide semiconductor layer 4a contains p-type impurities and the p-type oxide semiconductor as a whole exhibits p-type conductivity even after the metal oxide of the p-type oxide semiconductor is oxidized and causes a loss of p-type conductivity, it is important to prevent the metal oxide of the p-type oxide semiconductor from being oxidized because the p-type conductivity of the p-type oxide semiconductor as a whole decreases if the p-type conductivity is lost by the oxidation of the metal oxide.

The guard rings 4b are p-type oxide semiconductor layers configured of a p-type oxide semiconductor, and for example, the p-type oxide semiconductor is made of the same material as the p-type oxide semiconductor layer 4a. Although it is preferable that the semiconductor device includes a plurality of guard rings 4b and the number of guard rings is two or more as illustrated in FIGS. 1A and 1B, the number of guard rings may be one Also, the provision of the guard rings 4b is not an absolute necessity, and the semiconductor device may have a structure that includes no guard rings 4b.

The field plate insulation layer 6 is configured of, for example, an insulator material such as silicon dioxide ($SiO_2$), silicon nitride (SiN), gallium nitride (GaN), or aluminum oxide ($Al_2O_3$). The field plate insulation layer 6 is preferably an insulator that does not contain oxygen and is preferably SiN or GaN. The layer thickness of the field plate insulation layer 6 is approximately several hundred nanometers, and for example, in the range of approximately 100 nm to 200 nm. The insulator material that configures the field plate insulation layer 6 is preferably an insulator material whose critical dielectric breakdown voltage is higher than that of $Ga_2O_3$ that configures the n-type gallium oxide substrate 1.

The amount of oxygen contained in the nitride layer 7 is less than or equal to $5 \times 10^{18}$ cm$^{-3}$, and the oxygen content is desirably as small as possible. The nitride layer 7 is, for example, gallium nitride (GaN) or silicon nitride (SiN), and GaN is easy to manufacture and thus in particular preferable because the nitride layer 7 is formed on the n-type gallium oxide substrate 1. The layer thickness of the nitride layer 7 is preferably less than or equal to 500 nm, and more preferably less than or equal to 100 nm, because the nitride layer 7 needs to have a thickness that allows the PN junction between the n-type gallium oxide substrate 1 and both the p-type oxide semiconductor layer 4a and the guard rings 4b to form a depletion layer within the n-type gallium oxide substrate 1 when a reverse bias is applied to the semiconductor device 10 serving as a Schottky barrier diode. The layer thickness of the nitride layer 7 is yet more preferably less than or equal to 5 nm in order to pass current not only to the Schottky junction portion between the n-type gallium oxide substrate 1 and the anode electrode 3 but also to the PN junction portion between the n-type gallium oxide substrate 1 and the p-type oxide semiconductor layer 4a via the nitride layer 7 by a tunnel effect when a forward bias is applied to the semiconductor device 10 to increase the forward current. If the layer thickness of the nitride layer 7 is less than or equal to 5 nm, the tunnel effect is obtained due to incompleteness of the film of the nitride layer 7, allowing a sufficient amount of tunneling current to flow.

The nitride layer 7 is provided in order to suppress oxidation of the p-type oxide semiconductor of the p-type oxide semiconductor layer 4a by oxygen in the n-type gallium oxide substrate 1. Accordingly, the nitride layer 7 may have a small layer thickness or may be configured of a single-layer film of nitride such as GaN, as long as the intervention of the nitride layer 7 can avoid contact between the n-type gallium oxide substrate 1 and the p-type oxide semiconductor layer 4a. Generally a single-layer or more layer film is formed when the nitride layer 7 has a layer thickness of greater than or equal to 0.3 nm. Thus, in the case of using the layer thickness as a reference, the layer thickness of the nitride layer 7 may be set to be greater than or equal to 0.3 nm.

Here, the film thickness of the nitride layer 7 will be described. The material for the nitride layer 7 is generally an insulator. As the film thickness of the nitride layer 7 increases, the nitride layer 7 passes less electricity and the forward current decreases, which becomes the cause of degradation of the functional characteristics of the semiconductor device. However, electrons can pass through even the insulator if the insulator has a small film thickness. This phenomenon is called a tunnel effect. In general, the probability that electrons will pass through a potential barrier by the tunnel effect increases as the film thickness of the insulator decreases. Accordingly, the nitride layer 7 is desired to have such a film thickness that allows electricity to pass through by the tunnel effect and suppresses the occurrence of oxidation-reduction reactions at the interface of the pn junction.

Here, the film thickness of the nitride layer 7 is considered. As described above, the nitride layer 7 needs to have such a film thickness that allows electricity to pass through by the tunnel effect and suppresses the occurrence of oxidation-reduction reactions at the pn interface. The amount of electrons passing through the nitride layer 7 by the tunnel effect is defined by the probability (tunneling probability). The tunneling probability is given by Equation (1) below.

[Equation 1]

$$\text{Tunneling Probability} = \frac{4\alpha^2\beta^2}{4\alpha^2\beta^2 + (\alpha^2+\beta^2)^2 \sinh^2 \beta w} \quad (1)$$

Here, α and β are given by Equations (2) and (3) below.

[Equation 2]

$$\alpha^2 = \frac{2m}{\hbar^2} E \quad (2)$$

[Equation 3]

$$\beta^2 = \frac{2m}{\hbar^2}(\psi - E) \quad (3)$$

Here, w is the film thickness of the nitride layer 7, φ is the height of the barrier, and E is the energy of electrons. FIG. 2 illustrates the results of calculations of the tunneling probability when the energy of electrons is assumed to be 1 eV and the barrier height φ and the film thickness W of the nitride layer 7 are used as parameters. In FIG. 2, a, b, and c indicate the results of calculations for the cases where the heights of the barrier are respectively 3 eV, 2 eV, and 1.0001 eV. It can be seen from FIG. 2 that the film thickness of the nitride layer 7 is desirably set to be less than or equal to 0.1 nm in order to allow current to flow through the nitride layer 7 by the tunnel effect. However, in actuality, current is known to flow even if the insulator thin film has a film thickness of approximately 5 nm.

The above equation for obtaining the tunneling probability is obtained most simply from the Schrodinger's wave equation. However, the actual mechanism for passing current by the tunnel effect is not such a simple mechanism as described above, and many points still remain to be elucidated. For this reason, the film thickness of the nitride layer 7 is preferably less than or equal to 5 nm, more preferably less than or equal to 0.3 nm, and yet more preferably less than or equal to 0.1 nm, but as described previously, generally a single-layer or more layer film can be formed if the nitride layer 7 has a layer thickness greater than or equal to 0.3 nm. Thus, in the case of using the layer thickness as a reference, the layer thickness of the nitride layer 7 may be set to be greater than or equal to 0.3 nm.

The semiconductor device 10 is configured as described above. In the semiconductor device 10, the nitride layer 7 is provided between the n-type gallium oxide substrate 1 and the p-type oxide semiconductor layer 4a, and the p-type oxide semiconductor of the p-type oxide semiconductor layer 4a is not in contact with the n-type gallium oxide substrate 1. This prevents the p-type oxide semiconductor from being oxidized and thereby losing its p-type conductivity. Accordingly, a depletion layer of dimensions as designed can be formed within the n-type gallium oxide substrate 1. This improves the withstand voltage of the semiconductor device 10 serving as a Schottky barrier diode, reduces variations in characteristics, and thereby improves reliability.

Next, a method of manufacturing the semiconductor device 10 will be described.

Figure 5A:
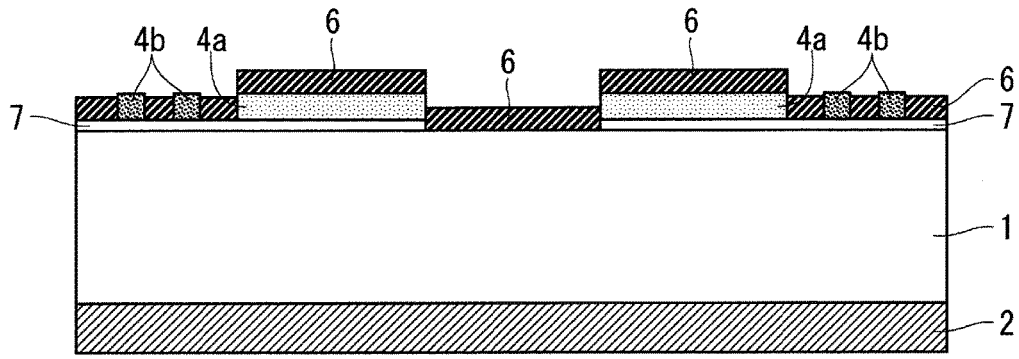
FIGS. 5A to 5C illustrate the semiconductor device manufacturing method according to Embodiment 1 of the present invention.
Figure 5B:
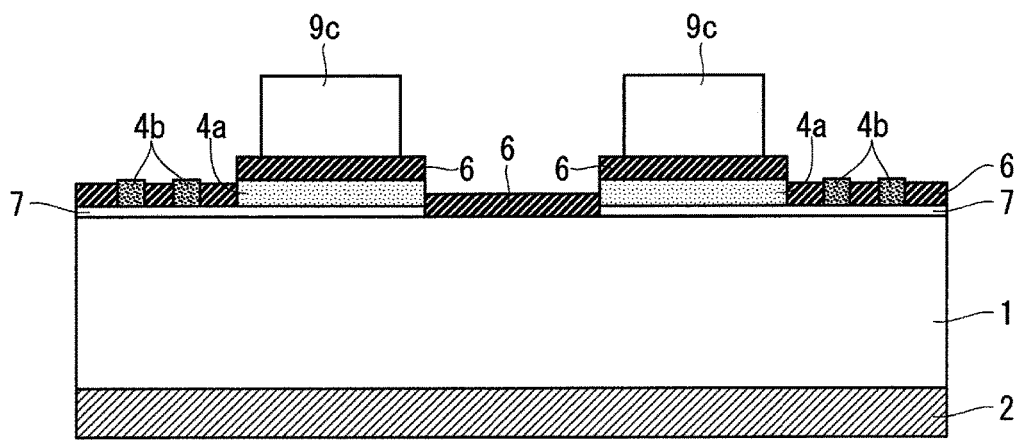
Figure 5C:
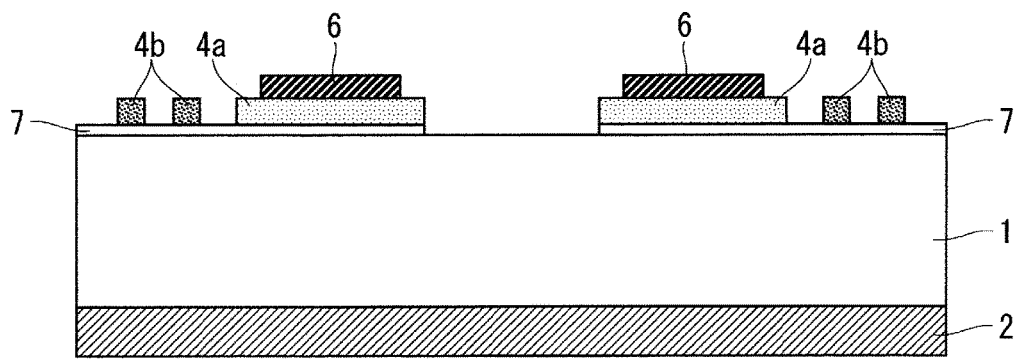
Figure 6A:
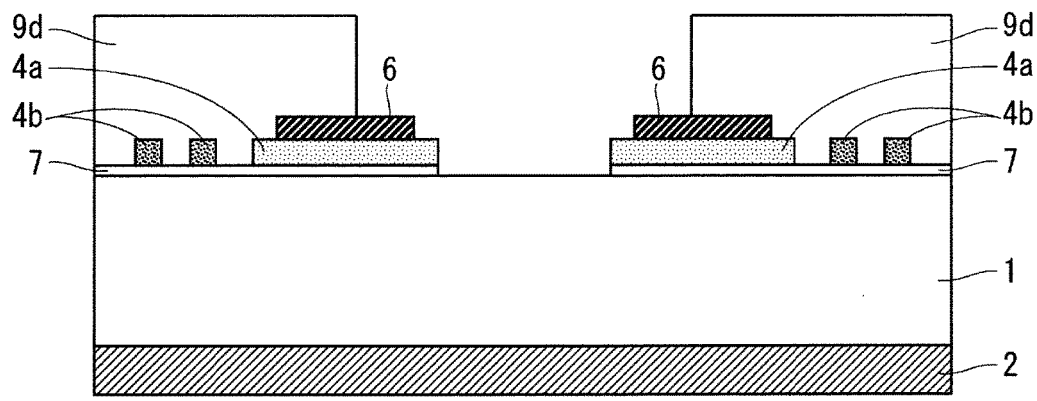
FIGS. 6A to 6C illustrate the semiconductor device manufacturing method according to Embodiment 1 of the present invention.
Figure 6B:
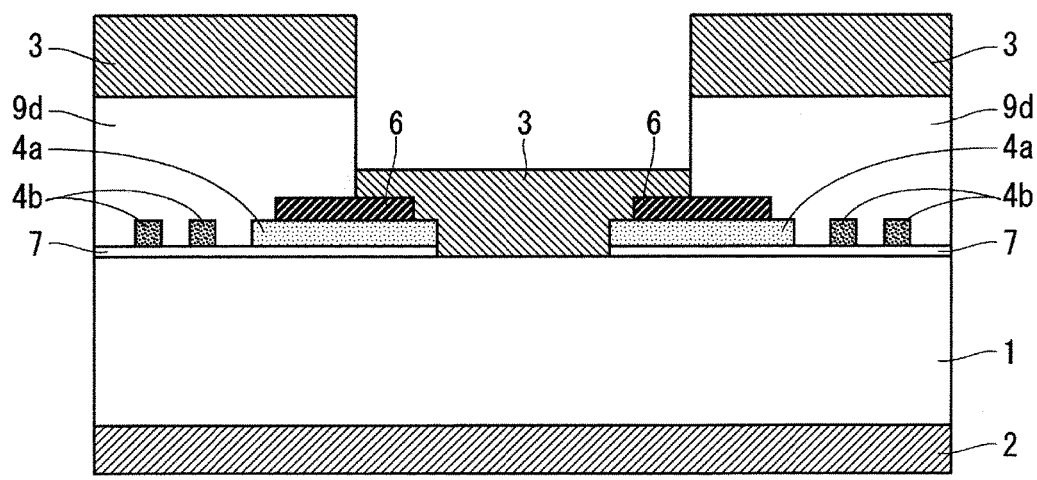
Figure 6C:
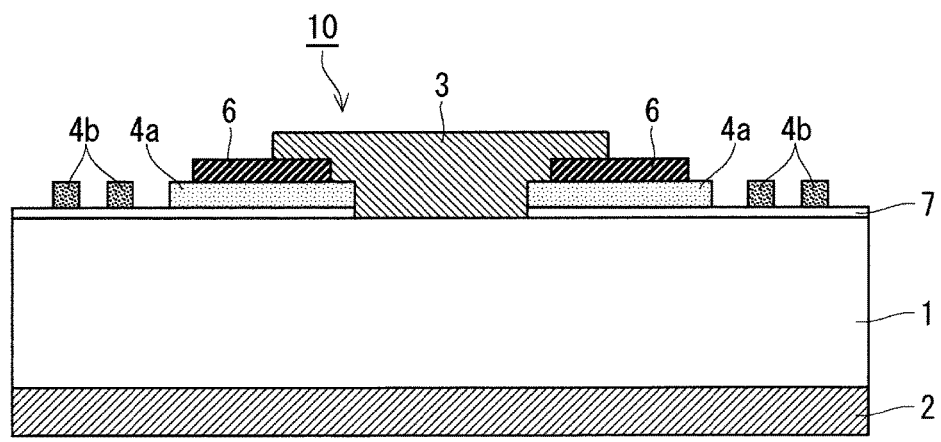

FIGS. 3A to 3D, 4A to 4C, 5A to 5C, and 6A to 6C illustrate a semiconductor device manufacturing method according to the present embodiment. FIGS. 3A, 3B, 3C, and 3D illustrate the steps up to the formation of the nitride layer 7 on the semiconductor device 10, and FIGS. 4A, 4B and 4C illustrate the steps up to the formation of the p-type oxide semiconductor layer 4 after the formation of the nitride layer 7. FIGS. 5A, 5B and 5C illustrate the steps up to the formation of the field plate insulation layer 6 after the formation of the p-type oxide semiconductor layer 4, and FIGS. 6A, 6B and 6C illustrate the steps up to the completion of the semiconductor device 10 after the formation of the field plate insulation layer 6.

Figure 3A:
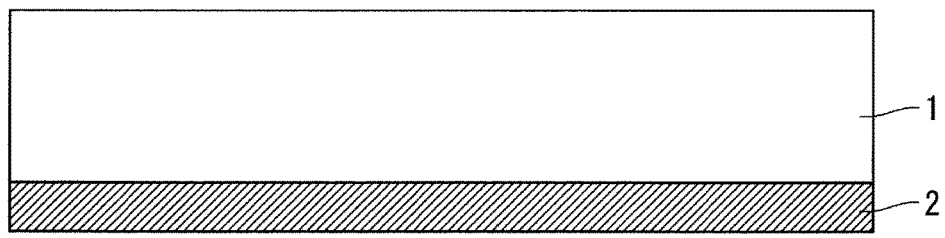
FIGS. 3A to 3D illustrate a semiconductor device manufacturing method according to Embodiment 1 of the present invention.

First, as illustrated in FIG. 3A, the cathode electrode 2 is formed on the second main surface of the n-type gallium oxide substrate 1. The n-type gallium oxide substrate 1 is, for example, a substrate obtained by cutting out a single-crystal bulk of β-Ga$_2$O$_3$ produced by the melt growth method in a substrate-like manner. Metallic materials that form the cathode electrode 2 are deposited by vapor deposition or sputtering on the second main surface of the n-type gallium oxide substrate 1. For example, the cathode electrode 2 having a two-layer structure is formed by depositing Ti to a thickness of 100 nm on the second main surface of the n-type gallium oxide substrate 1 by electron-beam evaporation (EB evaporation) and then depositing Ag to a thickness of 300 nm on Ti by electron-beam evaporation. Thereafter, for example, heat treatment is performed at 550° C. for five minutes in a nitrogen atmosphere or an oxygen atmosphere. As a result, the cathode electrode 2 that is ohmic joined with the n-type gallium oxide substrate 1 is formed on the second main surface of the n-type gallium oxide substrate 1.

Figure 3B:
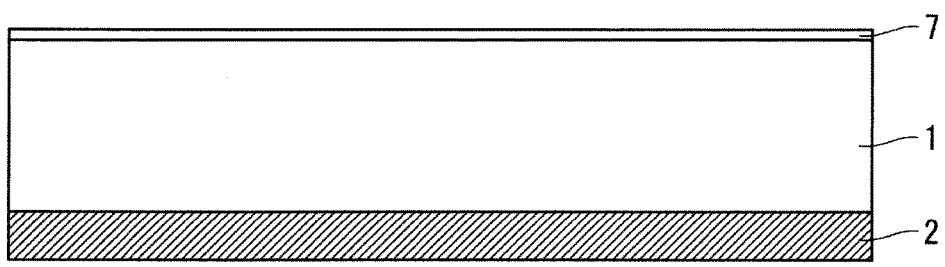

Next, as illustrated in FIG. 3(b), the nitride layer 7 is formed on the first main surface of the n-type gallium oxide substrate 1. The nitride layer 7 is formed by, for example, depositing GaN and SiN on the first main surface of the n-type gallium oxide substrate 1 by chemical vapor deposition (CVD).

As another forming method, the nitride layer 7 can be formed through nitridation of the first main surface of the n-type gallium oxide substrate 1. Examples of such a forming method include thermal nitriding and ammonia nitriding. In the case of using thermal nitriding, heat treatment is performed at 1100° C. in a nitrogen atmosphere on the n-type gallium oxide substrate 1 with the cathode electrode 2 formed on the second main surface as illustrated in FIG. 3(a). This heat treatment can cause Ga$_2$O$_3$ on the first main surface of the n-type gallium oxide substrate 1 to be decomposed and react with nitrogen (N), causing nitridation of Ga on the surface of the n-type gallium oxide substrate 1 and forming GaN on the first main surface of the n-type gallium oxide substrate 1. Even a heat treatment performed at 600° C. in a mixed gas atmosphere of nitrogen and hydrogen can form GaN on the first main surface of the n-type gallium oxide substrate 1 in the same manner. The heat treatment time may be less or equal to 5 minutes, and the layer thickness of the nitride layer 7 can be adjusted by controlling the heat treatment time.

Note that even if the 550° C. heat treatment is omitted from the step of forming the cathode electrode 2 in FIG. 3A, the cathode electrode 2 will be heat treated by heat treatment for forming GaN on the first main surface of the n-type gallium oxide substrate 1. Accordingly, the contact resistance between the cathode electrode 2 and the second main surface of the n-type gallium oxide substrate 1 can be reduced. Thus, the manufacturing process can be simplified if the nitride layer 7 is configured of GaN.

Figure 3C:
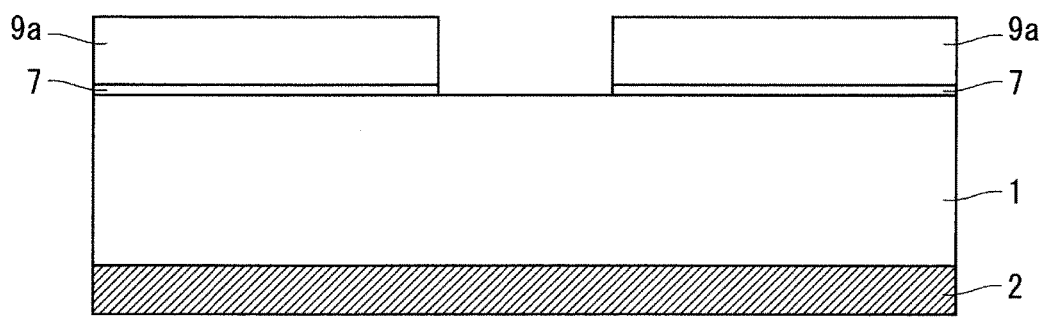
Figure 3D:
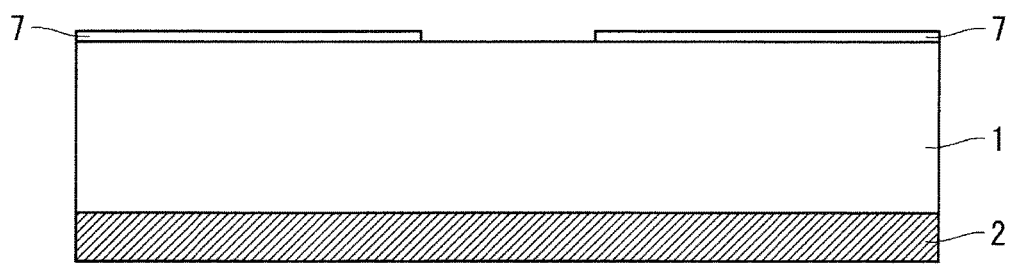

Next, as illustrated in FIG. 3C, a photoresist 9a having an opening in a region that becomes a Schottky junction portion between the n-type gallium oxide substrate 1 and the anode electrode 3 is formed on the nitride layer 7. Thereafter, as illustrated in FIG. 3D, the nitride layer 7 that is located in the opening of the photoresist 9a is removed by wet etching or dry etching so as to form an opening of the nitride layer 7 that exposes the first main surface of the n-type gallium oxide substrate 1. In the case of wet etching, for example, buffered hydrofluoric acid may be used as an etchant. Thereafter, the photoresist 9a is removed.

Next, as illustrated in FIG. 4A, the p-type oxide semiconductor layer 4 is formed on the first main surface of the n-type gallium oxide substrate 1, so that the p-type oxide semiconductor layer 4 is formed on the nitride layer 7. For example, in the case of forming the p-type oxide semiconductor layer 4 of $Cu_2O$, the p-type oxide semiconductor layer 4 can be formed by depositing $Cu_2O$ on the first main surface of the n-type gallium oxide substrate 1 by sputtering using $Cu_2O$ as a target in a mixed gas of an argon (Ar) gas and a nitrogen ($N_2$) gas. The p-type conductivity can be enhanced by increasing the partial pressure of $N_2$ in the mixed gas and thereby increasing the carrier density of the p-type oxide semiconductor layer 4, and the p-type conductivity can be reduced by reducing the partial pressure of $N_2$ in the mixed gas and thereby reducing the carrier density of the p-type oxide semiconductor layer 4.

In the case of forming the p-type oxide semiconductor layer 4 of another p-type oxide semiconductor such as $Ag_2O$ other than $Cu_2O$, other metal oxides such as $Ag_2O$ may be used as targets during sputtering in the above-described method. Also, the method of forming the p-type oxide semiconductor layer 4 is not limited to the above-described method, and the p-type oxide semiconductor layer 4 may be formed by other methods such as reactive plasma deposition (RPD) or ion plating.

Next, as illustrated in FIG. 4B, a photoresist 9b is formed on the p-type oxide semiconductor layer 4 formed on the first main surface of the n-type gallium oxide substrate 1. The photoresist 9b has an opening in a region that forms a Schottky junction portion between the n-type gallium oxide substrate 1 and the anode electrode 3. The photoresist 9b further has openings at predetermined positions, except at positions where the p-type oxide semiconductor layer 4a and the guard rings 4b are formed. Thereafter, as illustrated in FIG. 4C, the p-type oxide semiconductor that is located in the openings of the photoresist 9b is removed by wet etching or dry etching. As a result, the p-type oxide semiconductor layer 4a having an opening that exposes the first main surface of the n-type gallium oxide substrate 1 via the opening of the nitride layer 7, and the guard rings 4b are formed.

Next, as illustrated in FIG. 5A, the field plate insulation layer 6 is formed on the first main surface of the n-type gallium oxide substrate 1. The field plate insulation layer 6 can be formed by, for example, a film deposition method such as sputtering, chemical vapor deposition, or atomic layer deposition (ALD). The field plate insulation layer 6 can be made of, for example, a material such as $SiO_2$, SiN, GaN, or $Al_2O_3$. The critical breakdown strength of the material for the field plate insulation layer 6 is preferably higher than that of gallium oxide that serves as a material for the n-type gallium oxide substrate 1.

Next, as illustrated in FIG. 5B, a photoresist 9c is formed so as to mask a region where the field plate insulation layer 6 is formed. Thereafter, as illustrated in FIG. 5C, a portion of the field plate insulation layer 6 that is not masked by the photoresist 9c is removed by wet etching or dry etching so that the field plate insulation layer 6 on the p-type oxide semiconductor layer 4a remains. Then, the photoresist 9c is removed.

Next, as illustrated in FIG. 6A, a photoresist 9d having an opening is formed on the first main surface of the n-type gallium oxide substrate 1. The photoresist 9d is provided such that its opening is located at a position that includes the entire Schottky junction portion between the n-type gallium oxide substrate 1 and the anode electrode 3, the ohmic junction portion between the p-type oxide semiconductor layer 4a and the anode electrode 3, and a region of part of the field plate insulation layer 6 that surrounds the Schottky junction portion.

Thereafter, as illustrated in FIG. 6B, a metallic material that forms the anode electrode 3 is deposited by vapor deposition or sputtering on the first main surface side of the n-type gallium oxide substrate 1 so as to form the anode electrode 3 that is Schottky joined with the n-type gallium oxide substrate 1 and is ohmic-joined with the p-type oxide semiconductor layer 4. The metallic material that forms the anode electrode 3 is a metal that has a higher work function than the work function of the n-type gallium oxide substrate 1. For example, the anode electrode 3 having a two-layer structure may be formed by depositing Ni to a thickness of 100 nm by electron-beam evaporation and then depositing Ag to a thickness of 300 nm on Ni by electron-beam evaporation.

Then, as illustrated in FIG. 6C, the photoresist 9d is removed, and thereby the manufacture of the semiconductor device 10 is completed.

Note that in the case where Ni is used to form the anode electrode 3 that is Schottky joined with the n-type gallium oxide substrate 1 and is ohmic-joined with the p-type oxide semiconductor layer 4a, the Schottky junction with the n-type gallium oxide substrate 1 and the ohmic junction with the p-type oxide semiconductor layer 4a are formed without performing heat treatment. However, in order to reduce the contact resistance between the p-type oxide semiconductor layer 4a and the anode electrode 3, heat treatment may be performed at a temperature of less than or equal to 200° C. at which the p-type oxide semiconductor of the p-type oxide semiconductor layer 4a is not oxidized, before or after the removal of the photoresist 9d. Also, in the case where heat treatment is performed at a higher temperature, a cap layer that covers the p-type oxide semiconductor layer 4a and the guard rings 4b may be formed of GaN so as to allow the p-type oxide semiconductor to be heated without being oxidized.

Next, operations of the semiconductor device 10 according to the present invention will be described.

A voltage is applied between the anode electrode 3 and the cathode electrode 2 of the semiconductor device 10 from an electric circuit provided outside the semiconductor device 10. A forward bias refers to a case where the application of voltage causes the potential of the anode electrode 3 to become higher than the potential of the cathode electrode 2, and a reverse bias refers to a case where the application of voltage causes the potential of the anode electrode 3 to become lower than the potential of the cathode electrode 2. Since the semiconductor device 10 is a Schottky barrier diode, forward current flows from the anode electrode 3 to the cathode electrode 2 when a forward bias is applied, and current that flows between the anode electrode 3 and the cathode electrode 2 is cut off when a reverse bias is applied.

FIGS. 7A and 7B provide schematic cross-sectional views illustrating operations of the semiconductor device according to Embodiment 1 of the present invention. FIG. 7A is a schematic cross-sectional view illustrating the appearance of a depletion layer 90 formed within the n-type gallium oxide substrate 1 when a reverse bias is applied from an electric circuit 80 to the semiconductor device 10, and FIG. 7B is a schematic cross-sectional view illustrating the appearance of the depletion layer 90 formed within the n-type gallium oxide substrate 1 when a forward bias is applied from the electric circuit 80 to the semiconductor device 10. In FIGS. 7A and 7B, the lines indicated by dotted lines indicate the edges of the depletion layer 90 formed within the n-type gallium oxide substrate 1.

In the semiconductor device 10, the n-type gallium oxide substrate 1 and both the p-type oxide semiconductor layer 4a and the guard rings 4b form a PN junction via the nitride layer 7, and therefore the depletion layer 90 is formed within the n-type gallium oxide substrate 1. Since the nitride layer 7 is an insulator, a configuration in which the n-type gallium oxide substrate 1 and both the p-type oxide semiconductor layer 4a and the guard rings 4b are joined via the nitride layer 7 may be referred to as a PIN junction, but in the present embodiment, this configuration is referred to as a PN junction because a semiconductor device formed of an ordinary semiconducting material such as Si or SiC does not use a PIN junction in the termination structure and uses a PN junction in the termination structure.

When a reverse bias is applied to the semiconductor device 10 as illustrated in FIG. 7A, the potential of the p-type oxide semiconductor layer 4a becomes lower than the potential of the n-type gallium oxide substrate 1 because the p-type oxide semiconductor layer 4a is ohmic-joined with the anode electrode 3 and the n-type gallium oxide substrate 1 is ohmic-joined with the cathode electrode 2. As a result, as illustrated in FIG. 7A, the thickness of the depletion layer 90 increases, forcing the semiconductor device to a pinch-off state, and accordingly the entire Schottky junction portion between the n-type gallium oxide substrate 1 and the anode electrode 3 is covered with the depletion layer 90. Since the depletion layer 90 is an insulator, most of the reverse bias voltage applied between the anode electrode 3 and the cathode electrode 2 is applied to the depletion layer 90, and the voltage applied to the Schottky junction portion between the n-type gallium oxide substrate 1 and the anode electrode 3 considerably decreases as compared with the case where the depletion layer 90 is not present. As a result, the reverse withstand voltage of the semiconductor device 10 serving as a Schottky barrier diode can be improved.

On the other hand, when a forward bias is applied to the semiconductor device 10 as illustrated in FIG. 7B, the potential of the p-type oxide semiconductor layer 4a becomes higher than the potential of the n-type gallium oxide substrate 1 because the p-type oxide semiconductor layer 4a is ohmic-joined with the anode electrode 3 and the n-type gallium oxide substrate 1 is ohmic-joined with the cathode electrode 2. As a result, as illustrated in FIG. 7B, the thickness of the depletion layer 90 decreases, a region where the depletion layer 90 is not present is formed in the Schottky junction portion between the n-type gallium oxide substrate 1 and the anode electrode 3, and electrons move from the n-type gallium oxide substrate 1 to the anode electrode 3. That is, current flows from the anode electrode 3 toward the cathode electrode 2, and the semiconductor device 10 serving as a Schottky barrier diode is brought into conduction.

In this way, even if the semiconductor device 10 according to the present embodiment is a Schottky barrier diode configured using the n-type gallium oxide substrate 1, the reverse withstand voltage of the Schottky barrier diode can be improved by providing a PN junction portion adjacent to and around a Schottky junction portion and using a depletion layer formed by the PN junction as in the case of, for example, the Schottky barrier diode formed of a silicon carbide semiconductor (SiC) described in Patent Document 2. Many Schottky barrier diodes formed of SiC use such a termination structure formed by the PN junction, but since there is no need for the Schottky barrier diodes using SiC to provide an insulation layer at the PN junction between the p-type semiconductor and the n-type semiconductor to form a PIN junction, an insulation layer is not provided between the p-type semiconductor and the n-type semiconductor.

In a gallium oxide semiconductor, while the n-type carrier density can easily be controlled by doping with n-type impurities such as Si or Sn, it is extremely difficult to control the p-type carrier density by doping with p-type impurities, and there has been no report stating that evident hole conduction has been observed as a result of doping with p-type impurities. Thus, as in the case of a Schottky barrier diode formed of SiC, it is not possible to improve the withstand voltage of the Schottky junction portion by doping the n-type gallium oxide substrate 1 with p-type impurities and thereby forming a p-type semiconductor.

However, the semiconductor device 10 according to the present embodiment implements a configuration in which the depletion layer 90 is formed within the n-type gallium oxide substrate 1 by the PN junction between the n-type gallium oxide substrate 1 and the p-type oxide semiconductor layer 4a, as a result of the p-type oxide semiconductor layer 4a being formed not within the n-type gallium oxide substrate 1, but on the n-type gallium oxide substrate 1, i.e., on the surface of the n-type gallium oxide substrate 1, to surround the Schottky junction portion.

Then, the semiconductor device 10 according to the present embodiment is configured such that the nitride layer 7 is provided between the n-type gallium oxide substrate 1 and the p-type oxide semiconductor layer 4a and thereby the p-type oxide semiconductor of the p-type oxide semiconductor layer 4a is prevented from coming in contact with the n-type gallium oxide substrate 1, being oxidized by oxygen in the n-type gallium oxide substrate 1, and thereby losing its p-type conductivity. As a result, in the semiconductor device 10 according to the present embodiment, the p-type oxide semiconductor layer 4a can exhibit p-type conductivity as designed. This allows the depletion layer 90 formed by the PN junction between the p-type oxide semiconductor layer 4a and the n-type gallium oxide substrate 1 to have dimensions as designed, and thereby implements the semiconductor device 10 having a reverse withstand voltage as designed.

Also, even if the p-type oxide semiconductor layer 4a contains p-type impurities, the p-type carrier density is a total of metal atom deficiency and p-type impurities in the metal oxide that configures the p-type oxide semiconductor. Thus, the nitride layer 7 provided between the n-type gallium oxide substrate 1 and the p-type oxide semiconductor layer 4a can prevent a reduction in the p-type carrier density due to metal atom deficiency caused by oxidation of the p-type oxide semiconductor and thus prevent a reduction in the p-type conductivity of the p-type oxide semiconductor as a whole. Accordingly, the semiconductor device 10 having a reverse withstand voltage as designed can be obtained.

Even if a semiconductor device does not include a nitride layer between the n-type gallium oxide substrate 1 and the p-type oxide semiconductor layer 4a and has a different configuration from that of the semiconductor device 10 according to the present embodiment, a case is also conceivable in which if the amount of the p-type oxide semiconductor layer 4a oxidized by oxygen in the n-type gallium oxide substrate 1 is small, a depletion layer can be formed within the n-type gallium oxide substrate 1 without the p-type oxide semiconductor layer 4a losing its p-type conductivity. However, in such a case, the amount of oxidation of the p-type oxide semiconductor layer 4a is not a controlled amount and varies according to error in manufacturing conditions due to variations in position in the substrate or according to a change over time during use. This increases variations in the reverse withstand voltage and creates problems such as a reduction in manufacturing yield and reliability.

In contrast, the semiconductor device 10 according to the present embodiment is configured to include the nitride layer 7 between the n-type gallium oxide substrate 1 and the p-type oxide semiconductor layer 4a. This configuration suppresses oxidation of the p-type oxide semiconductor layer 4a due to the n-type gallium oxide substrate 1 and prevents the p-type oxide semiconductor layer 4a from losing its p-type conductivity due to oxidation, thus achieving a stable reverse withstand voltage and improving manufacturing yield and reliability.

While Embodiment 1 of the present invention describes the effect of the nitride layer 7 suppressing oxidation of the p-type oxide semiconductor layer 4a, the nitride layer 7 is also provided between the n-type gallium oxide substrate 1 and the guard rings 4b and therefore suppresses oxidation of the guard rings 4b and prevents the guard rings 4b from losing their p-type conductivity. This stabilizes the depletion layer formed by the guard rings 4b. As a result, as in the case of the p-type oxide semiconductor layer 4a, it is possible to stabilize the reverse withstand voltage of the semiconductor device 10 and to improve manufacturing yield and reliability. That is, according to the configuration of the present embodiment, even in the case where the termination structure is formed by providing a p-type oxide semiconductor layer adjacent to and around an active region of a semiconductor device formed of an n-type oxide semiconductor layer, the nitride layer 7 provided between the n-type oxide semiconductor layer and the p-type oxide semiconductor layer can prevent the p-type oxide semiconductor layer from being oxidized by oxygen in the n-type oxide semiconductor layer.

While Embodiment 1 of the present invention describes a semiconductor device in which the p-type oxide semiconductor layer 4a and the nitride layer 7 are provided on the surface of the n-type gallium oxide substrate 1, the configuration of the semiconductor device is not limited to this configuration. For example, the semiconductor device may be configured such that the p-type oxide semiconductor layer 4a and the nitride layer 7 are provided within the n-type gallium oxide substrate 1, as in the case of a Schottky barrier diode using SiC, by forming a recess in advance in the n-type gallium oxide substrate 1 by etching and then forming the nitride layer 7 and the p-type oxide semiconductor layer 4a so as to be buried in this recess.

Embodiment 2

Figure 8:
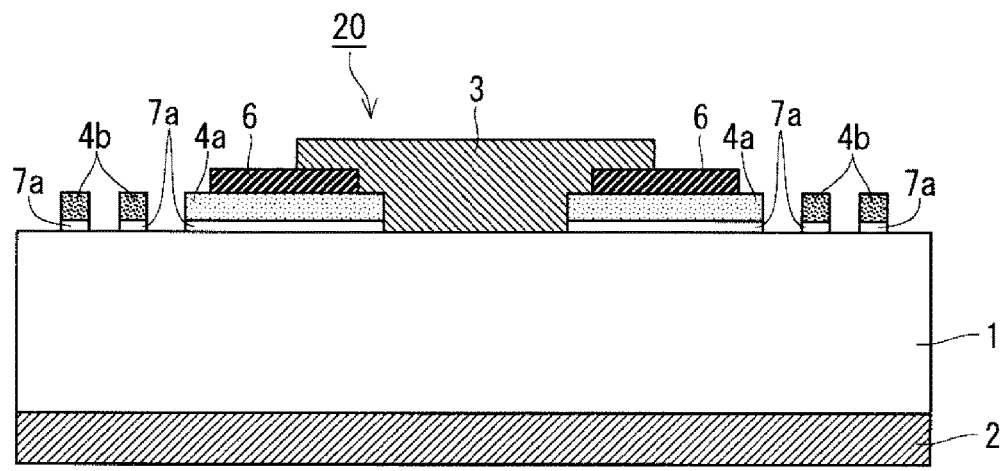
FIG. 8 is a cross-sectional view of a semiconductor device according to Embodiment 2 of the present invention.

FIG. 8 is a cross-sectional view of a semiconductor device according to Embodiment 2 of the present invention. In FIG. 8, the same reference numerals as in FIG. 1A denote the same or corresponding constituent elements, and therefore description thereof is omitted. This semiconductor device is different from that of Embodiment 1 of the present invention in configuration in which a nitride layer 7a is provided only between the n-type gallium oxide substrate 1 serving as an n-type oxide semiconductor layer and both the p-type oxide semiconductor layer 4a and the guard rings 4b, which are formed of p-type oxide semiconductors.

As illustrated in FIG. 8, the nitride layer 7a of a semiconductor device 20 is provided only in places where the p-type oxide semiconductor layer 4a and the guard rings 4b are provided. The nitride layer 7a is provided in order to prevent the p-type oxide semiconductor from being oxidized by the n-type gallium oxide substrate 1 serving as the n-type oxide semiconductor layer, and therefore may be provided between the n-type gallium oxide substrate 1 and both the p-type oxide semiconductor layer 4a and the guard rings 4b. Accordingly, there is no need to provide the nitride layer 7a on the entire first main surface of the n-type gallium oxide substrate 1, except the Schottky junction portion, as in the semiconductor device 10 described in Embodiment 1.

The semiconductor device 20 illustrated in FIG. 8 can simplify the manufacturing process because the nitride layer 7a and the p-type oxide semiconductor are provided at the same places. That is, after the nitride layer is formed on the entire first main surface of the n-type gallium oxide substrate 1 as illustrated in FIG. 3B in Embodiment 1, the steps in FIGS. 3C and 3D are omitted, and the p-type oxide semiconductor layer 4 may be formed on the nitride layer formed on the entire first main surface as illustrated in FIG. 4A. Thereafter, predetermined regions may be masked as illustrated in FIG. 4B, and unnecessary portions of the nitride layer and the p-type oxide semiconductor layer may be removed by etching.

As described above, the semiconductor device 20 with the configuration illustrated in FIG. 8 can also achieve the same effect as that of the semiconductor device 10 described in Embodiment 1. Moreover, the manufacturing process can be simplified and accordingly the manufacturing cost of the semiconductor device 20 can be reduced.

Figure 9:
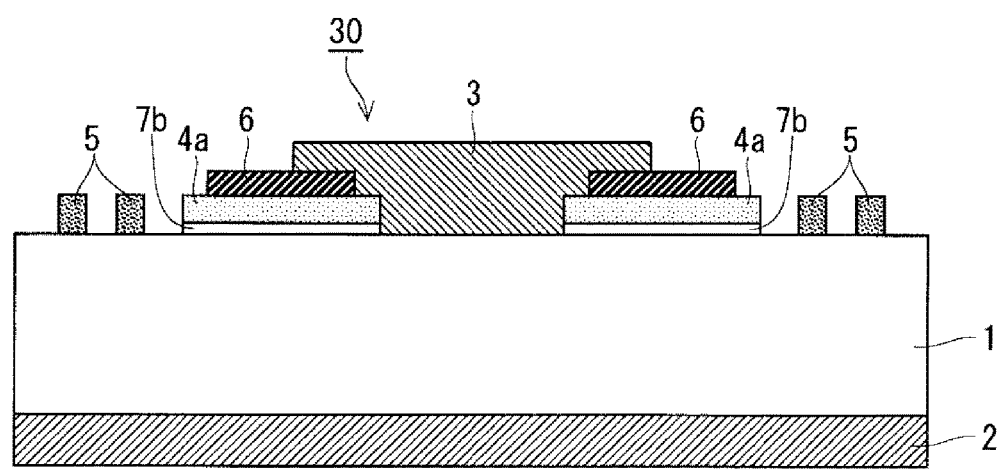
FIG. 9 is a cross-sectional view of a semiconductor device with another configuration according to Embodiment 2 of the present invention.

FIG. 9 is a cross-sectional view of a semiconductor device with another configuration according to Embodiment 2 of the present invention. In FIG. 9, the same reference numerals as in FIG. 1A denote the same or corresponding constituent elements, and therefore description thereof is omitted. This semiconductor device is different from that of Embodiment 1 of the present invention in configuration in which a nitride layer 7b is provided only between the n-type gallium oxide substrate 1 and the p-type oxide semiconductor layer 4a of a p-type oxide semiconductor, and guard rings 5 are formed of a p-type semiconducting material different from that of the p-type oxide semiconductor layer 4a.

As illustrated in FIG. 9, the nitride layer 7b of a semiconductor device 30 is provided only between the n-type gallium oxide substrate 1 and the p-type oxide semiconductor layer 4a provided adjacent to and around the Schottky junction portion. The guard rings 5 are formed of a p-type semiconductor that is a different material from the material for the p-type oxide semiconductor layer 4a, and for example, may be configured of GaN doped with p-type impurities. In the case where the guard rings 5 are formed of GaN, the guard rings 5 may be formed by a film deposition process such as CVD after the nitride layer 7b and the p-type oxide semiconductor layer 4a have been formed. In this way, if the guard rings 5 are formed of a p-type semiconductor that does not lose its p-type conductivity due to oxidation, there is no need to provide a nitride layer between the guard rings 5 and the n-type gallium oxide substrate 1.

The semiconductor device 30 with the configuration illustrated in FIG. 9 can also achieve the same effect as that of the semiconductor device 10 described in Embodiment 1 because the nitride layer 7b prevents the p-type oxide semiconductor layer 4a formed of the p-type oxide semiconductor from being oxidized by oxygen in the n-type gallium oxide substrate 1.

Note that description is given regarding cases where the semiconductor device 20 illustrated in FIG. 8 and the semiconductor device 30 illustrated in FIG. 9 respectively include double guard rings 4b and 5, and the number of guard rings may be one or three or more as described in Embodiment 1, but the semiconductor device may have a configuration that includes no guard rings.

Embodiment 3

Figure 10A:
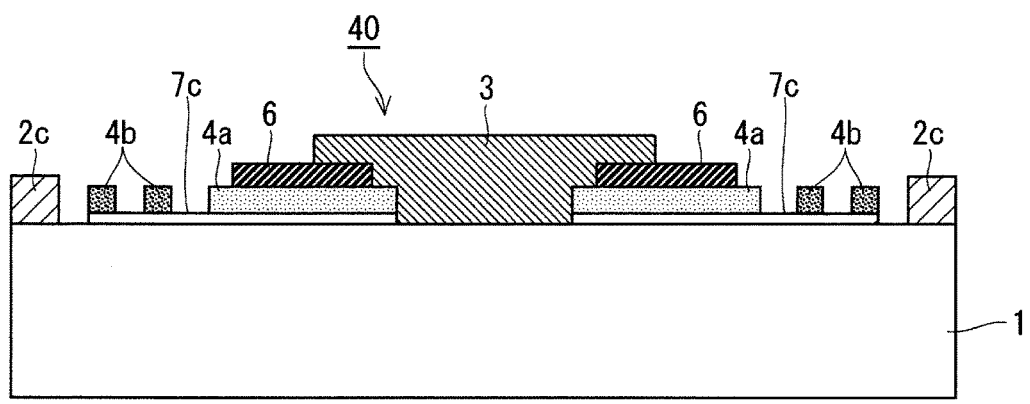
FIG. 10A provides a cross-sectional view and FIG. 10B provides a top view of a semiconductor device according to Embodiment 3 of the present invention.
Figure 10B:
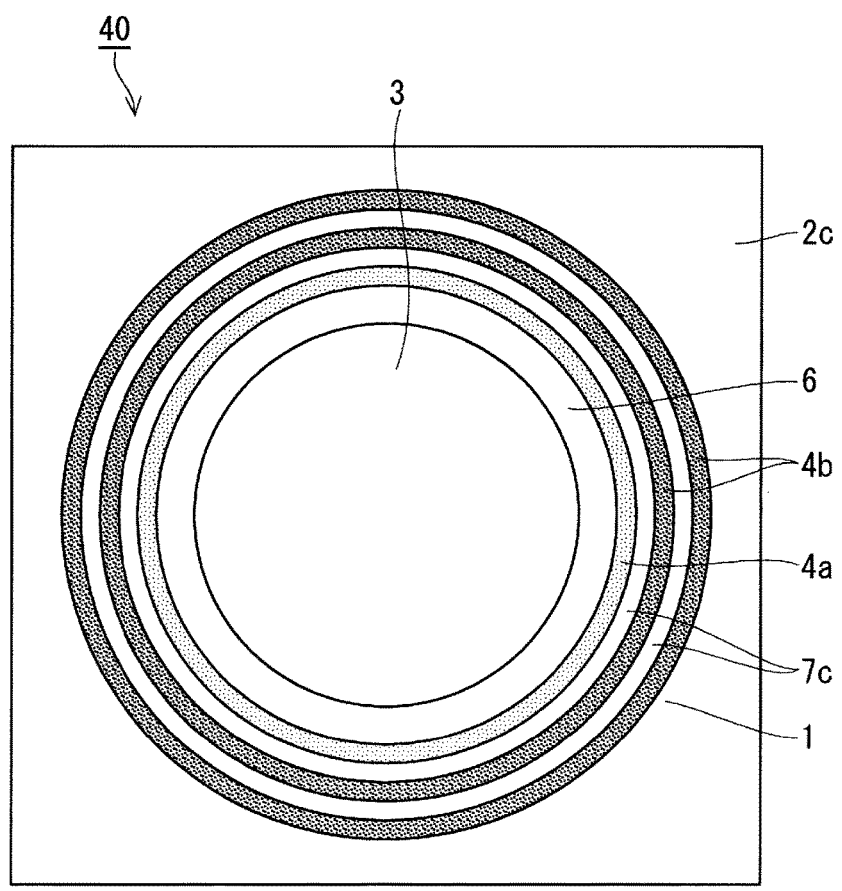

FIG. 10A provides a cross-sectional view and FIG. 10B provides a top view of a semiconductor device according to Embodiment 3 of the present invention. FIG. 10A is a cross-sectional view illustrating a configuration of a semiconductor device 40, and FIG. 10B is a top view illustrating the configuration of the semiconductor device 40. In FIGS. 10A and 10B, the same reference numerals as in FIGS. 1A and 1B denote the same or corresponding constituent elements, and therefore description thereof is omitted. This semiconductor device is different from that of Embodiment 1 of the present invention in configuration in that a cathode electrode 2c is provided on the first main surface of the n-type gallium oxide substrate 1, i.e., on the same main surface as that where the anode electrode 3 is provided.

As illustrated in FIG. 10A in the semiconductor device 40, the anode electrode 3 that is Schottky joined with the n-type gallium oxide substrate 1 is provided on the first main surface of the n-type gallium oxide substrate 1 serving as an n-type oxide semiconductor layer, and the p-type oxide semiconductor layer 4a is provided adjacent to and around the Schottky junction portion between the n-type gallium oxide substrate 1 and the anode electrode 3. The p-type oxide semiconductor layer 4a is ohmic-joined with the anode electrode 3, and the field plate insulation layer 6 is provided on the p-type oxide semiconductor layer 4a. Moreover, the guard rings 4b are provided outside the p-type oxide semiconductor layer 4a, and a nitride layer 7c is provided between the n-type gallium oxide substrate 1 and both the p-type oxide semiconductor layer 4a and the guard rings 4b. That is, the configuration of the semiconductor device 40 on the center side of the guard rings 4b on the first main surface of the n-type gallium oxide substrate 1 is the same as that of the semiconductor device 10 described in Embodiment 1.

The semiconductor device 40 in FIG. 10A includes a cathode electrode 2c provided outside the guard rings 4b, and does not have a cathode electrode on the second main surface of the n-type gallium oxide substrate 1. The cathode electrode 2c provided on the first main surface of the n-type gallium oxide substrate 1 is ohmic-joined with the n-type gallium oxide substrate 1. As described in Embodiment 1, the cathode electrode 2c may include, for example, a first layer formed of Ti and a second layer formed of Ag. Although the cathode electrode 2c in FIG. 10B is configured to surround the Schottky junction portion between the n-type gallium oxide substrate 1 and the anode electrode 3, the cathode electrode 2c does not necessarily have to be provided to surround the Schottky junction portion as long as it is provided forming an ohmic junction with the first main surface of the n-type gallium oxide substrate 1.

In the semiconductor device 40 described in Embodiment 3, the nitride layer 7c is also provided between the n-type gallium oxide substrate 1 and both the p-type oxide semiconductor layer 4a and the guard rings 4b, which are formed of p-type oxide semiconductors. This prevents the p-type oxide semiconductor layer 4a and the guard rings 4b from being oxidized by oxygen in the n-type gallium oxide substrate 1 and losing their p-type conductivity. Accordingly, as described in Embodiment 1, the depletion layer is formed within the n-type gallium oxide substrate 1 by the p-type oxide semiconductor layer 4a and the guard rings 4b, improving the reverse withstand voltage of the semiconductor device 40 serving as a Schottky barrier diode.

Note that, in the semiconductor device 40 illustrated in FIG. 10A, the guard rings 4b are not limited to double guard rings, and the number of guard rings may be one or three or more, or the semiconductor device may have a configuration that includes no guard rings 4b, as in the semiconductor devices described in the other embodiments. Also, the nitride layer 7c may be provided at least between the n-type gallium oxide substrate 1 and the p-type oxide semiconductor layer 4a.

Embodiment 4

Figure 11A:
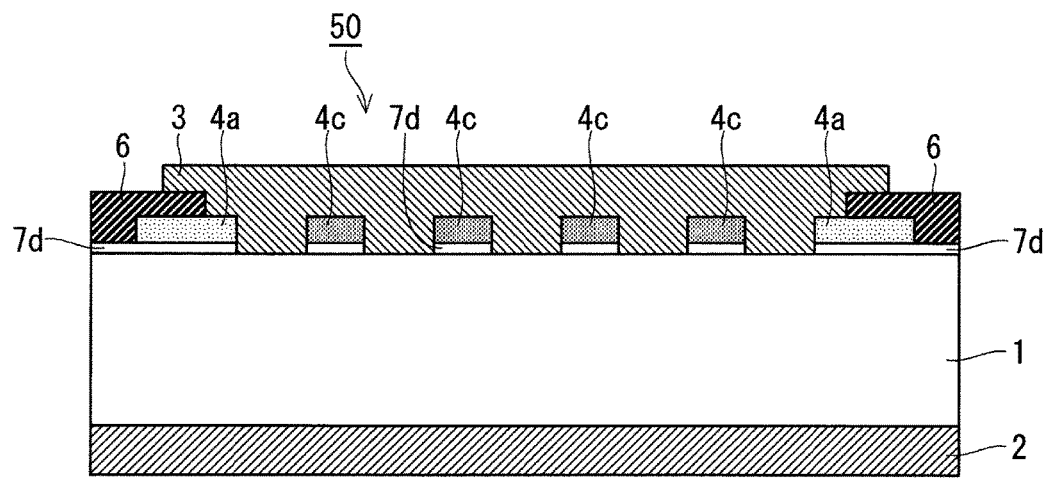
FIG. 11A provides a cross-sectional view and FIG. 11B provides a partial top view of a semiconductor device according to Embodiment 4 of the present invention.
Figure 11B:
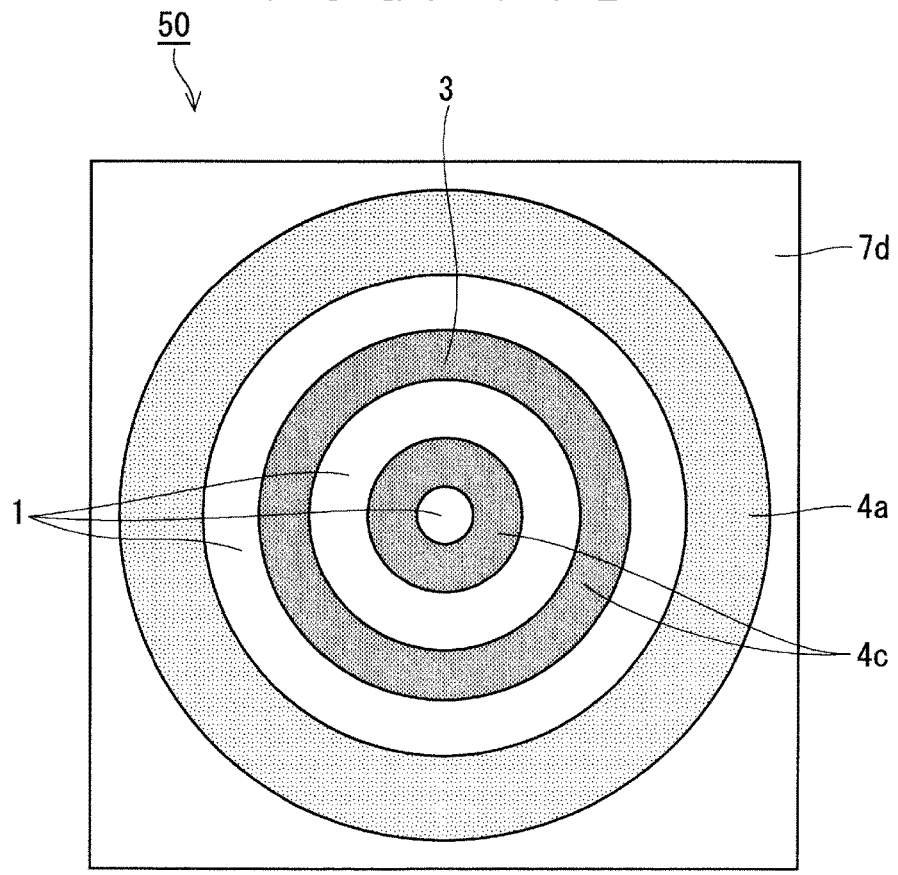

FIG. 11A provides a cross-sectional view and FIG. 11B provides a partial top view of a semiconductor device according to Embodiment 4 of the present invention. FIG. 11A is a cross-sectional view illustrating a configuration of a semiconductor device 50, and FIG. 11B is a top view illustrating the configuration of the semiconductor device 50, with the anode electrode 3 and the field plate insulation layer 6 omitted. In FIGS. 11A and 11B, the same reference numerals as in FIGS. 1A and 1B denote the same or corresponding constituent elements, and therefore description thereof is omitted. This semiconductor device is different from that of Embodiment 1 of the present invention in configuration in which a plurality of p-type oxide semiconductor layers 4c are provided on the center side of the p-type oxide semiconductor layer 4a that constitutes a termination structure, and the anode electrode 3 is Schottky joined with a plurality of portions of the n-type gallium oxide substrate 1.

As illustrated in FIG. 11A, in the semiconductor device 50, the cathode electrode 2 that is ohmic joined with the n-type gallium oxide substrate 1 is provided on the second main surface of the n-type gallium oxide substrate 1 serving as an n-type oxide semiconductor layer. Note that the cathode electrode 2 may be provided on the first main surface of the n-type gallium oxide substrate 1 as in the semiconductor device described in Embodiment 3.

The anode electrode 3 that is Schottky joined with the n-type gallium oxide substrate 1 is provided on the first main surface of the n-type gallium oxide substrate 1, and the p-type oxide semiconductor layer 4a is provided adjacent to and around the Schottky junction portion. A nitride layer 7d is provided between the p-type oxide semiconductor layer 4a and the n-type gallium oxide substrate 1 and prevents the p-type oxide semiconductor layer 4a from being oxidized by oxygen in the n-type gallium oxide substrate 1. Also, the field plate insulation layer 6 is provided on a region of part of the p-type oxide semiconductor layer 4a, and the anode electrode 3 is provided on a region of part of the field plate insulation layer 6. The anode electrode 3 is ohmic-joined with the p-type oxide semiconductor layer 4a. In this way, the structure around the p-type oxide semiconductor layer 4a is the same as that of the semiconductor device described in Embodiment 1, and the p-type oxide semiconductor layer 4a constitutes a termination structure of the semiconductor device 50. Note that although the semiconductor device 50 in FIG. 11A has no guard rings outside the p-type oxide semiconductor layer 4a, guard rings may be provided in the same manner as in the semiconductor device described in Embodiment 1.

The p-type oxide semiconductor layers 4c formed of the same p-type oxide semiconductor as that of the p-type oxide semiconductor layer 4a are provided inside the p-type oxide semiconductor layer 4a, and the p-type oxide semiconductor layers 4c is ohmic-joined with the anode electrode 3. As illustrated in FIGS. 11A and 11B, the p-type oxide semiconductor layers 4c are provided in the form of double rings, and a Schottky junction portion between the n-type gallium oxide substrate 1 and the anode electrode 3 is provided between one and another of the p-type oxide semiconductor layers 4c and between the p-type oxide semiconductor layers 4c and the p-type oxide semiconductor layer 4a. That is, the anode electrode 3 is Schottky joined with a plurality of portions of the first main surface of the n-type gallium oxide substrate 1, and at least one of the p-type oxide semiconductor layer 4a and the p-type oxide semiconductor layers 4c, which serve as p-type oxide semiconductor layers, is provided adjacent to and between the plurality of Schottky junction portions between the anode electrode 3 and the n-type gallium oxide substrate 1. In order to prevent oxidation of the p-type oxide semiconductor layers 4c, the nitride layer 7d is provided between the p-type oxide semiconductor layers 4c and the n-type gallium oxide substrate 1.

The p-type oxide semiconductor layer 4a and the p-type oxide semiconductor layers 4c are formed of the same p-type oxide semiconductor material. That is, as illustrated in FIG. 11B, a plurality of Schottky junction portions between the n-type gallium oxide substrate 1 and the anode electrode 3 are formed by removing, together with the nitride layer, a plurality of regions of part of the p-type oxide semiconductor layer formed via the nitride layer on the first main surface of the n-type gallium oxide substrate 1. In the semiconductor device 50 illustrated in FIGS. 11A and 11B, the Schottky junction portions are provided in the form of double concentric circles, but they may be provided in the form of a plurality of stripes or in the form of a dot pattern consisting of a plurality of dots. Such a structure can be formed by forming a nitride layer and a p-type oxide semiconductor layer on the n-type gallium oxide substrate 1, then forming a photoresist having openings at positions where the Schottky junction portions are to be formed, and removing the nitride layer and the p-type oxide semiconductor layer in the openings by dry etching or wet etching.

Next, operations of the semiconductor device 50 will be described.

When a reverse bias voltage is applied between the anode electrode 3 and the cathode electrode 2 of the semiconductor device 50 from an external electric circuit, the thickness of the depletion layer formed within the n-type gallium oxide substrate 1 by the p-type oxide semiconductor layers 4a and 4c and the n-type gallium oxide substrate 1 increases as described in Embodiment 1, thereby forcing the semiconductor device to a pinch-off state, and accordingly the Schottky junction portions between the n-type gallium oxide substrate 1 and the anode electrode 3 are covered with the depletion layer. As a result, most of the reverse bias voltage applied to the semiconductor device 50 is applied to the depletion layer. This considerably reduces the voltage to be applied to the Schottky junction portions and improves the reverse withstand voltage of the semiconductor device 50.

On the other hand, when a forward bias voltage is applied between the anode electrode 3 and the cathode electrode 2 of the semiconductor device 50 from an external electric circuit, the thickness of the depletion layer formed within the n-type gallium oxide substrate 1 by the p-type oxide semiconductor layers 4a and 4c and the n-type gallium oxide substrate 1 decreases as described in Embodiment 1. This produces regions where the depletion layer 90 is not present in the Schottky junction portions between the n-type gallium oxide substrate 1 and the anode electrode 3, causes current to flow from the anode electrode 3 toward the cathode electrode 2, and brings the semiconductor device 50 into conduction.

Then, when the forward current flowing through the semiconductor device 50 increases and the forward bias voltage applied to the semiconductor device 50 increases and exceeds the internal potential of the PN junction between the n-type gallium oxide substrate 1 and the p-type oxide semiconductor layers 4c, holes are injected from the p-type oxide semiconductor layers 4c via the nitride layer 7d into the n-type gallium oxide substrate 1, and the ratio of the hole current in the current flowing through the semiconductor device 50 increases. Accordingly, the configuration of the semiconductor device 50 illustrated in FIGS. 11A and 11B can improve characteristics for the case where a large forward current flows, and as a result, can increase the withstand surge voltage of the semiconductor device 50.

As described above, since the semiconductor device 50 has a configuration using the forward current flowing through the PN junction between the p-type oxide semiconductor layers 4c and the n-type gallium oxide substrate 1, it is preferable that the nitride layer 7d provided between the p-type oxide semiconductor layers 4c and the n-type gallium oxide substrate 1 has a small layer thickness. As described in Embodiment 1, since the tunneling current flows if the layer thickness of the nitride layer 7d is less than or equal to 5 nm, the configuration in which a large forward current flows by the presence of the PN junction portions between the p-type oxide semiconductor layers 4c and the n-type gallium oxide substrate 1 is preferable. Since the nitride layer 7d is provided in order to prevent the p-type oxide semiconductor layers 4c from being oxidized by oxygen in the n-type gallium oxide substrate 1, the nitride layer 7d may be a single-layer film, and it is sufficient for the nitride layer 7d to have a layer thickness of greater than or equal to 0.3 nm. That is, the layer thickness of the nitride layer 7d is preferably greater than or equal to the layer thickness of a single-layer film, and more preferably less than or equal to 5 nm. Yet more preferably, the layer thickness of the nitride layer 7d is greater than or equal to 0.3 nm and less than or equal to 5 nm.

Embodiment 5

Figure 12:
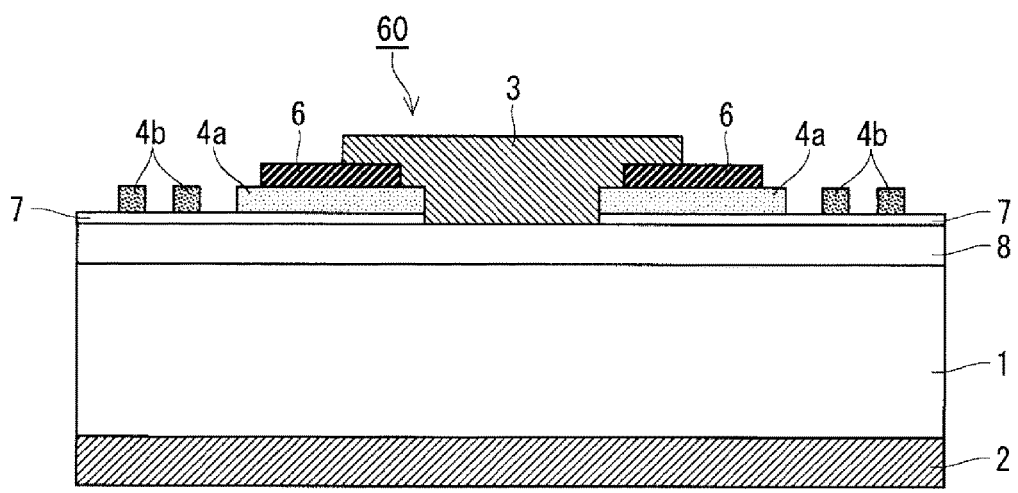
FIG. 12 is a cross-sectional view of a semiconductor device according to Embodiment 5 of the present invention.

FIG. 12 is a cross-sectional view of a semiconductor device according to Embodiment 5 of the present invention. In FIG. 12, the same reference numerals as in FIG. 1A denote the same or corresponding constituent elements, and therefore description thereof is omitted. This semiconductor device is different from that of Embodiment 1 of the present invention in configuration in which an n-type gallium oxide epitaxial layer 8 is provided on the first main surface of the n-type gallium oxide substrate 1, and the n-type gallium oxide epitaxial layer 8 and the anode electrode 3 is Schottky-joined. That is, although the n-type oxide semiconductor layer in the semiconductor device described in Embodiment 1 is configured by the n-type gallium oxide substrate 1, the n-type oxide semiconductor layer in the semiconductor device 60 according to Embodiment 5 of the present invention is configured by the n-type gallium oxide substrate 1 and the n-type gallium oxide epitaxial layer 8 provided on the n-type gallium oxide substrate 1. According to Embodiment 5 of the present invention, the first main surface of the n-type oxide semiconductor layer refers to the surface of the n-type gallium oxide epitaxial layer 8, and the second main surface of the n-type oxide semiconductor layer refers to the same surface as the second main surface of the n-type gallium oxide substrate 1.

While Embodiment 5 of the present invention describes a semiconductor device with a configuration in which the n-type oxide semiconductor layer configured by the n-type gallium oxide substrate 1 in the semiconductor device with the configuration described in Embodiment 1 is replaced by the n-type oxide semiconductor layer configured by the n-type gallium oxide epitaxial layer 8 and the n-type gallium oxide substrate 1, the semiconductor device may be configured such that the n-type oxide semiconductor layer configured by the n-type gallium oxide substrate 1 in the semiconductor devices with the configurations described in Embodiments 2 to 4 is replaced by the n-type oxide semiconductor layer configured by the n-type gallium oxide epitaxial layer 8 and the n-type gallium oxide substrate 1. It is, however, noted that in the semiconductor device described in Embodiment 3 in which the cathode electrode 2 is provided on the same first main surface of the n-type gallium oxide substrate 1 as where the anode electrode 3 is provided, an ohmic junction may be formed between the n-type gallium oxide epitaxial layer 8 and the cathode electrode 2, but in order to reduce the contact resistance at the ohmic junction between the cathode electrode 2 and the n-type gallium oxide substrate 1, it is preferable either to remove a portion of the n-type gallium oxide epitaxial layer where the cathode electrode 2 is provided, or to increase n-type impurities in a portion of the n-type gallium oxide epitaxial layer where the cathode electrode 2 is provided.

The n-type gallium oxide epitaxial layer 8 is a layer having a lower n-type carrier density than the n-type gallium oxide substrate 1. Here, the n-type carrier density refers to a total density of oxygen deficiency and doped n-type impurities in gallium oxide as described in Embodiment 1. The n-type gallium oxide epitaxial layer 8 can be formed on the first main surface of the n-type gallium oxide substrate 1 by a method such as metal organic chemical vapor deposition (MOCVD), molecular beam epitaxy (MBE), or hydride vapor phase epitaxy (HYPE).

For example, in the case where the n-type gallium oxide epitaxial layer 8 is formed by MBE, Ga metal, $SnO_2$ powder, and a mixed gas of ozone (5%) and oxygen (95%) are used as growth materials and the growth temperature is set in the range of 540° C. to 570° C. so as to form the n-type gallium oxide epitaxial layer 8 doped with n-type impurities of Sn on the first main surface of the n-type gallium oxide substrate 1.

In the semiconductor device 60, the anode electrode 3 that forms a Schottky junction with the n-type gallium oxide epitaxial layer 8 is provided on the first main surface of the n-type gallium oxide substrate 1, and the p-type oxide semiconductor layer 4a is provided adjacent to and around the Schottky junction portion between the n-type gallium oxide epitaxial layer 8 and the anode electrode 3. In order to prevent the p-type oxide semiconductor layer 4a from being oxidized by oxygen in the n-type gallium oxide epitaxial layer 8, the nitride layer 7 is provided between the p-type oxide semiconductor layer 4a and the n-type gallium oxide epitaxial layer 8. The anode electrode 3 and the p-type oxide semiconductor layer 4a is ohmic-joined. The field plate insulation layer 6 is provided on the p-type oxide semiconductor layer 4a, and the anode electrode 3 is also provided on the field plate insulation layer 6, which configures a field plate structure. Also, the guard rings 4b are provided outside the p-type oxide semiconductor layer 4a, and the guard rings 4b and the p-type oxide semiconductor layer 4a constitute a termination structure. The nitride layer 7 is also provided between the guard rings 4b formed of a p-type oxide semiconductor and the n-type gallium oxide epitaxial layer 8.

Also, the cathode electrode 2 that is ohmic-joined with the second main surface of the n-type gallium oxide substrate 1 is provided on the second main surface of the n-type gallium oxide substrate 1. Since the n-type carrier density of the n-type gallium oxide substrate 1 is in the range of approximately $1 \times 10^{17}$ cm$^{-3}$ to $1 \times 10^{18}$ cm$^{-3}$, the n-type gallium oxide substrate 1 can easily form an ohmic junction with the cathode electrode 2. However, the n-type gallium oxide epitaxial layer 8 has a lower n-type carrier density than the n-type gallium oxide substrate 1 and thus may have difficulty in forming an ohmic junction with the cathode electrode 2. For this reason, in the case where the cathode electrode 2 is provided on the same first main surface of the n-type gallium oxide substrate 1 as where the anode electrode 3 is provided as in the semiconductor device described in Embodiment 3, it is preferable that either the n-type gallium oxide epitaxial layer 8 in a region where the cathode electrode 2 is to be provided is removed so as to form an ohmic junction between the cathode electrode 2 and the n-type gallium oxide substrate 1, or the n-type gallium oxide epitaxial layer 8 in the region where the cathode electrode 2 is to be provided is doped with n-type impurities so as to form an ohmic junction between the cathode electrode 2 and the n-type gallium oxide epitaxial layer 8.

Since the semiconductor device 60 includes the n-type gallium oxide epitaxial layer 8 having a lower n-type carrier density than the n-type gallium oxide substrate 1, the voltage applied between the anode electrode 3 and the cathode electrode 2 of the semiconductor device 60 is applied to the n-type gallium oxide epitaxial layer 8 that has a higher specific resistance than the n-type gallium oxide substrate 1. Accordingly, the withstand voltage of the semiconductor device 60 can be improved.

Also, the n-type gallium oxide epitaxial layer 8 is a film formed by homoepitaxial growth on the n-type gallium oxide substrate 1 and therefore can control the n-type carrier density with higher precision than the n-type gallium oxide substrate 1, suppress variations in the characteristics of the semiconductor device 60, and improve the reliability of the semiconductor device 60. Note that the n-type carrier density of the n-type gallium oxide epitaxial layer 8 does not necessarily have to be lower than that of the n-type gallium oxide substrate 1, and may be the same as or higher than that of the n-type gallium oxide substrate 1.

While Embodiments 1 to 5 describe cases where the material for the n-type oxide semiconductor layer is gallium oxide, the material for the n-type oxide semiconductor layer may be an n-type oxide semiconductor made of other metal oxides such as zinc oxide or indium oxide. Even in the case where the material for the n-type oxide semiconductor layer is a metal oxide other than gallium oxide, if a p-type oxide semiconductor layer is formed in contact with the n-type oxide semiconductor layer, the p-type oxide semiconductor of the p-type oxide semiconductor layer is oxidized by oxygen in the n-type oxide semiconductor layer and loses its p-type conductivity. However, as described in the embodiments of the present invention, if a nitride layer is provided between the n-type oxide semiconductor layer and the p-type oxide semiconductor layer, the p-type oxide semiconductor of the p-type oxide semiconductor layer is prevented from being oxidized and losing its p-type conductivity. This achieves the same effect as that of the semiconductor device described in each embodiment.

Also, in the case where the n-type oxide semiconductor layer is formed of an n-type oxide semiconductor made of a metal oxide other than gallium oxide, such as zinc oxide or indium oxide, a nitride layer may be formed through nitridation of metal of the metal oxide contained in the surface of the n-type oxide semiconductor layer. As in the case of gallium oxide, the nitridation of the metal of the metal oxide can be implemented by thermal nitriding or ammonia nitriding.

While the embodiments of the present invention describe cases where the n-type oxide semiconductor layer is configured by an n-type gallium oxide substrate and where the n-type oxide semiconductor layer is configured by the n-type gallium oxide substrate and the n-type gallium oxide epitaxial layer provided on the n-type gallium oxide substrate, the n-type oxide semiconductor layer may be an n-type oxide semiconductor layer formed on an insulator substrate. In the case where the n-type oxide semiconductor layer is formed on such a substrate, the semiconductor device may be configured to have a structure in which the anode electrode and the cathode electrode are provided on the same main surface as described in Embodiment 3.

While Embodiments 1 to 5 describe cases where the semiconductor device serves as a Schottky barrier diode, the semiconductor device may be a semiconductor device having other configurations such as a diode or a transistor. For example, the configuration of the present invention described in each embodiment may be used as a termination structure of a Schottky gate of a metal-semiconductor field-effect transistor (MESFET) formed of an oxide semiconductor such as gallium oxide. The configuration of the present invention may also be used as a termination structure provided around an electrode that is ohmic-joined with an n-type oxide semiconductor layer such as the drain or source of a semiconductor device such as an MESFET, an MOSFET, or a metal-insulator-semiconductor field-effect transistor (MISFET) formed of an oxide semiconductor. That is, the oxidation of the p-type oxide semiconductor layer by oxygen in the n-type oxide semiconductor layer may be prevented by providing a termination structure of a p-type oxide semiconductor around an ohmic junction portion where an electrode is ohmic-joined with an n-type oxide semiconductor layer, and providing a nitride layer between the n-type oxide semiconductor layer and the p-type oxide semiconductor layer.

EXPLANATION OF REFERENCE SIGNS

1: n-type gallium oxide substrate, 2, 2c: cathode electrode, 3: anode electrode, 4, 4a, 4c: p-type oxide semiconductor layer, 4b, 5: guard ring, 6: field plate insulation layer, 7, 7a, 7b, 7c, 7d: nitride layer, 8: n-type gallium oxide epitaxial layer, 9b, 9c, 9d: photoresist, 10, 20, 30, 40, 50, 60: semiconductor device, 80: electric circuit, 90: depletion layer, W: film thickness

The invention claimed is:

1. A semiconductor device comprising:
an n-type oxide semiconductor layer;
a first electrode joined to a first main surface of the n-type oxide semiconductor layer; and
a second electrode provided on the first main surface of the n-type oxide semiconductor layer or on a second main surface that is a surface on a rear side of the first main surface,
wherein current flows between the first electrode and the second electrode via the n-type oxide semiconductor layer provided between the first electrode and the second electrode,
the semiconductor device further comprising:
a p-type oxide semiconductor layer provided adjacent to a junction between the first electrode and the n-type oxide semiconductor layer; and
a nitride layer provided between the p-type oxide semiconductor layer and the n-type oxide semiconductor layer.

2. The semiconductor device according to claim 1, wherein
the nitride layer is provided on a surface of the n-type oxide semiconductor layer, and
the p-type oxide semiconductor layer is provided on the nitride layer.

3. The semiconductor device according to claim 1, wherein
a layer thickness of the nitride layer is greater than or equal to 0.3 nm and less than or equal to 5 nm.

4. The semiconductor device according to claim 1, wherein
a material for the n-type oxide semiconductor layer is gallium oxide.

5. The semiconductor device according to claim 4, wherein
the n-type oxide semiconductor layer is configured by an n-type gallium oxide substrate.

6. The semiconductor device according to claim 4, wherein
the n-type oxide semiconductor layer is configured by an n-type gallium oxide substrate and an n-type gallium oxide epitaxial layer provided on the n-type gallium oxide substrate, and
the first electrode is joined to the n-type gallium oxide epitaxial layer.

7. The semiconductor device according to claim 1, wherein
the first electrode and the n-type oxide semiconductor layer are Schottky-joined.

8. The semiconductor device according to claim 7, wherein
the first electrode further is ohmic-joined with the p-type oxide semiconductor layer.

9. The semiconductor device according to claim 8, wherein
a plurality of Schottky junction portions that the first electrode and the n-type oxide semiconductor layer are Schottky joined are formed, and
the nitride layer and the p-type oxide semiconductor layer are provided between the plurality of Schottky junction portions.

10. The semiconductor device according to claim 8, further comprising:
a field plate insulation layer provided on part of the p-type oxide semiconductor layer, wherein the first electrode is provided to cover the p-type oxide semiconductor layer and the field plate insulation layer.

11. The semiconductor device according to claim 1, wherein
the first electrode is provided on the first main surface, and the second electrode is provided on the second main surface.

12. The semiconductor device according to claim 1, wherein
a material for the nitride layer is GaN.

13. The semiconductor device according to claim 1, wherein
a material for the p-type oxide semiconductor layer includes one of $Cu_2O$, $Ag_2O$, NiO, and SnO.

14. A semiconductor device manufacturing method comprising the steps of:
forming a nitride layer on a surface of an n-type oxide semiconductor layer that contains metal oxide, through nitridation of the metal contained in the metal oxide, the nitride layer having an opening that exposes the n-type oxide semiconductor layer;
forming a p-type oxide semiconductor layer on the nitride layer; and
forming an electrode that is joined to the n-type oxide semiconductor layer in the opening.

15. The semiconductor device manufacturing method according to claim 14, wherein
the metal of the metal oxide is Ga.

\* \* \* \* \*